(12) United States Patent
Corrigan, III et al.

(10) Patent No.: US 6,575,548 B1
(45) Date of Patent: Jun. 10, 2003

(54) SYSTEM AND METHOD FOR CONTROLLING ENERGY CHARACTERISTICS OF AN INKJET PRINTHEAD

(75) Inventors: George H. Corrigan, III, Corvallis, OR (US); Graham Ross, Poway, CA (US); John M Wade, Poway, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/253,447

(22) Filed: Feb. 19, 1999

Related U.S. Application Data

(63) Continuation-in-part of application No. 08/958,951, filed on Oct. 28, 1997, now Pat. No. 6,183,056.

(51) Int. Cl.[7] .................................................. B41J 2/01
(52) U.S. Cl. ......................................................... 347/19
(58) Field of Search ................................. 347/9, 14, 19

(56) References Cited

U.S. PATENT DOCUMENTS

| | | | |
|---|---|---|---|
| 4,463,359 A | 7/1984 | Ayata et al. ................. 346/1.1 |
| 4,695,853 A | 9/1987 | Hackleman et al. .... 346/140 R |
| 4,695,854 A | 9/1987 | Cruz-Uribe ............. 346/140 R |
| 4,719,477 A | 1/1988 | Hess ....................... 346/140 R |
| 4,764,659 A | 8/1988 | Minami et al. ............. 219/216 |
| 4,982,199 A | 1/1991 | Dunn ......................... 346/1.1 |
| 4,999,650 A | 3/1991 | Braun .................... 346/140 R |
| 5,016,023 A | 5/1991 | Chan et al. ................... 346/1.1 |
| 5,030,971 A | 7/1991 | Drake et al. ............ 346/140 R |
| 5,049,898 A | 9/1991 | Arthur et al. ................ 346/1.1 |
| 5,103,246 A | 4/1992 | Dunn ..................... 346/140 R |
| 5,179,389 A | * 1/1993 | Arai et al. ....................... 347/7 |
| 5,265,315 A | * 11/1993 | Hoisington et al. |
| 5,363,134 A | 11/1994 | Barbehenn et al. ........... 347/49 |
| 5,371,530 A | 12/1994 | Hawkins et al. ............... 347/9 |
| 5,504,507 A | * 4/1996 | Watrobski et al. ............ 347/19 |
| 5,526,027 A | * 6/1996 | Wade et al. ................... 347/14 |
| 5,610,635 A | 3/1997 | Murray et al. ................. 347/7 |
| 5,629,578 A | * 5/1997 | Winzer et al. .............. 310/334 |
| 5,646,660 A | 7/1997 | Murray ........................ 347/59 |
| 5,648,804 A | 7/1997 | Keefe et al. .................. 347/47 |
| 5,699,091 A | * 12/1997 | Bullock et al. ............... 347/19 |
| 5,815,180 A | 9/1998 | Barbour et al. ............... 347/59 |

* cited by examiner

Primary Examiner—Craig Hallacher

(57) ABSTRACT

This present invention is embodied in a printing system and protocol for providing efficient control of energy characteristics of an inkjet printhead. The printing system includes a controller, a power supply and a printhead assembly having a memory device and a distributive processor integrated with an ink driver. The distributive processor maintains energy characteristics of the printhead assembly within preprogrammed acceptable boundaries.

22 Claims, 24 Drawing Sheets

SYSTEM AND METHOD FOR CONTROLLING ENERGY CHARACTERISTICS OF AN INKJET PRINTHEAD

This application is a continuation in part of Ser. No. 08/958,951 filed Oct. 28, 1997, now U.S. Pat. No. 6,183,056.

FIELD OF THE INVENTION

The present invention generally relates to inkjet and other types of printers and more particularly, to a novel printing system and protocol including a printhead assembly having an integrated distributive processor for controlling the energy characteristics of an inkjet printhead.

BACKGROUND OF THE INVENTION

Inkjet printers are commonplace in the computer field. These printers are described by W. J. Lloyd and H. T. Taub in "Ink Jet Devices," Chapter 13 of *Output Hardcopy Devices* (Ed. R. C. Durbeck and S. Sherr, San Diego: Academic Press, 1988) and U.S. Pat. Nos. 4,490,728 and 4,313,684. Inkjet printers produce high quality print, are compact and portable, and print quickly and quietly because only ink strikes a printing medium, such as paper.

An inkjet printer produces a printed image by printing a pattern of individual dots at particular locations of an array defined for the printing medium. The locations are conveniently visualized as being small dots in a rectilinear array. The locations are sometimes "dot locations", "dot positions", or pixels". Thus, the printing operation can be viewed as the filling of a pattern of dot locations with dots of ink.

Inkjet printers print dots by ejecting very small drops of ink onto the print medium and typically include a movable carriage that supports one or more print cartridges each having a printhead with ink ejecting nozzles. The carriage traverses over the surface of the print medium. An ink supply, such as an ink reservoir, supplies ink to the nozzles. The nozzles are controlled to eject drops of ink at appropriate times pursuant to command of a microcomputer or other controller. The timing of the application of the ink drops typically corresponds to the pattern of pixels of the image being printed.

In general, the small drops of ink are ejected from the nozzles through orifices or nozzles by rapidly heating a small volume of ink located in vaporization chambers with small electric heaters, such as small thin film resistors. The small thin film resistors are usually located adjacent the vaporization chambers. Heating the ink causes the ink to vaporize and be ejected from the orifices.

Specifically, for one dot of ink, a remote printhead controller, which is usually located as part of the processing electronics of the printer, activates an electrical current from an external power supply. The electrical current is passed through a selected thin film resistor of a selected vaporization chamber. The resistor is then heated for superheating a thin layer of ink located within the selected vaporization chamber, causing explosive vaporization, and, consequently, a droplet of ink is ejected through an associated orifice of the printhead.

However, in typical inkjet printers, as each droplet of ink is ejected from the printhead, some of the heat used to vaporize the ink driving the droplet is retained within the printhead and for high flow rates, conduction can heat the ink near the substrate. These actions can overheat the printhead, which can degrade print quality, cause the nozzles to misfire, or can cause the printhead to stop firing completely. Printhead overheating compromises the inkjet printing process and limits high throughput printing. In addition, current inkjet printheads do not have the ability to make their own firing and timing decisions because they are controlled by remote devices. Consequently. it is difficult to efficiently control important thermal and energy aspects of the printhead.

Therefore, what is needed is a new printing system and protocol that utilizes a printhead with an integrated distributive processor and ink driver head for providing localized efficient control of energy characteristics of the printhead assembly.

SUMMARY OF THE INVENTION

To overcome the limitations in the prior art described above, and to overcome other limitations that will become apparent upon reading and understanding the present specification, the present invention is embodied in a novel printing system and protocol for providing efficient control of energy characteristics of inkjet printhead. The printing system includes a controller, a power supply and a printhead assembly having a distributive processor integrated with an inkjet driver head.

The distributive processor has the ability to make its own energy control decisions based on sensed and preprogrammed information. Several components and systems within the printhead assembly have a minimum and a maximum operating voltage and the distributive processor helps to maintain the printhead assembly within these boundaries. The preprogrammed information can be stored within a memory device and used by the distributive processor for providing the printhead assembly with the optimal power to regulate the operating voltage. The present invention can regulate the energy delivered to the printhead assembly by sensing printhead assembly temperatures, amount of voltage supplied and knowing optimal temperature and energy ranges. In addition, the distributive processor can aid in calibrating the printhead assembly in real time.

The printing system can also include an ink supply device having its own memory and can be fluidically coupled to the printhead assembly for selectively providing ink to the printhead assembly when necessary.

BRIEF DESCRIPTION OF THE DRAWINGS

The present invention can be further understood by reference to the following description and attached drawings that illustrate the preferred embodiment. Other features and advantages will be apparent from the following detailed description of the preferred embodiment, taken in conjunction with the accompanying drawings, which illustrate, by way of example, the principles of the invention.

DETAILED DESCRIPTION OF THE PREFERRED EMBODIMENTS

In the following description of the invention, reference is made to the accompanying drawings, which form a part hereof, and in which is shown by way of illustration a specific example in which the invention may be practiced. It is to be understood that other embodiments may be utilized and structural changes may be made without departing from the scope of the present invention.

I. GENERAL OVERVIEW

Figure 1A:
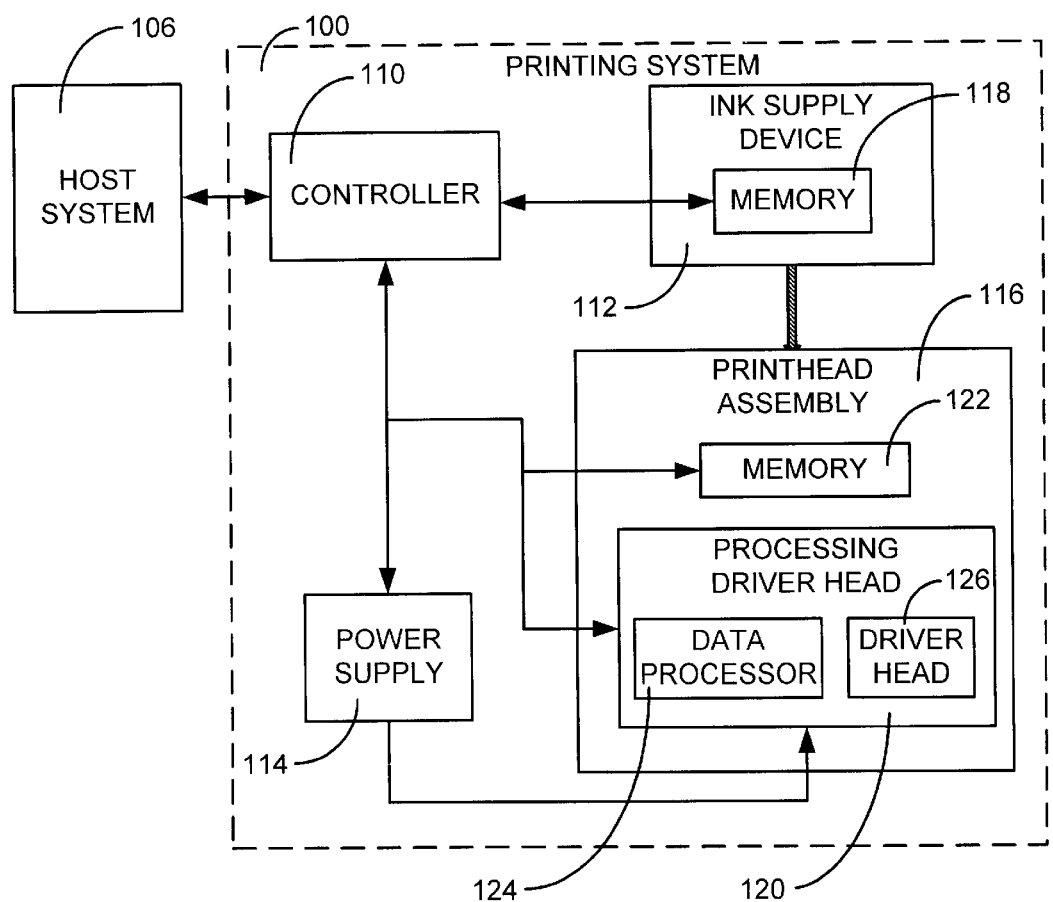
FIG. 1A shows a block diagram of an overall printing system incorporating the present invention.

FIG. 1A shows a block diagram of an overall printing system incorporating the present invention. The printing system 100 can be used for printing a material, such as ink on a print media, which can be paper. The printing system 100 is electrically coupled to a host system 106, which can be a computer or microprocessor for producing print data. The printing system 100 includes a controller 110 coupled to an ink supply device 112, a power supply 114 and a printhead assembly 116. The ink supply device 112 includes an ink supply memory device 118 and is fluidically coupled to the printhead assembly 116 for selectively providing ink to the printhead assembly 116. The printhead assembly 116 includes a processing driver head 120 and a printhead memory device 122. The processing driver head 120 is comprised of a data processor 124, such as a distributive processor, and a driver head 126, such as an array of inkjet nozzles or drop generators.

During operation of the printing system 100, the power supply 114 provides a controlled voltage to the controller 110 and the processing driver head 120. Also, the controller 110 receives the print data from the host system and processes the data into printer control information and image data. The processed data, image data and other static and dynamically generated data (discussed in detail below), is exchanged with the ink supply device 112 and the printhead assembly 116 for efficiently controlling the printing system.

The ink supply memory device 118 can store various ink supply specific data, including ink identification data, ink characterization data, ink usage data and the like. The ink supply data can be written and stored in the ink supply memory device 118 at the time the ink supply device 112 is manufactured or during operation of the printing system 100. Similarly, the printhead memory device 122 can store various printhead specific data, including printhead identification data, warranty data, printhead characterization data, printhead usage data, etc. This data can be written and stored in the printhead memory device 122 at the time the printhead assembly 116 is manufactured or during operation of the printing system 100.

Although the data processor 124 can communicate with memory devices 118, 122, the data processor 124 preferably primarily communicates with the controller 110 in a bi-directional manner. The bi-directional communication enables the data processor 124 to dynamically formulate and perform its own firing and timing operations based on sensed and given operating information for regulating the temperature of, and the energy delivered to the processing driver head 120. These formulated decisions are preferably based on, among other things, sensed printhead temperatures, sensed amount of power supplied, real time tests, and preprogrammed known optimal operating ranges, such as temperature and energy ranges, scan axis directionality errors. As a result, the data processor 124 enables efficient operation of the processing driver head 120 and produces droplets of ink that are printed on a print media to form a desired pattern for generating enhanced printed outputs.

Figure 1B:
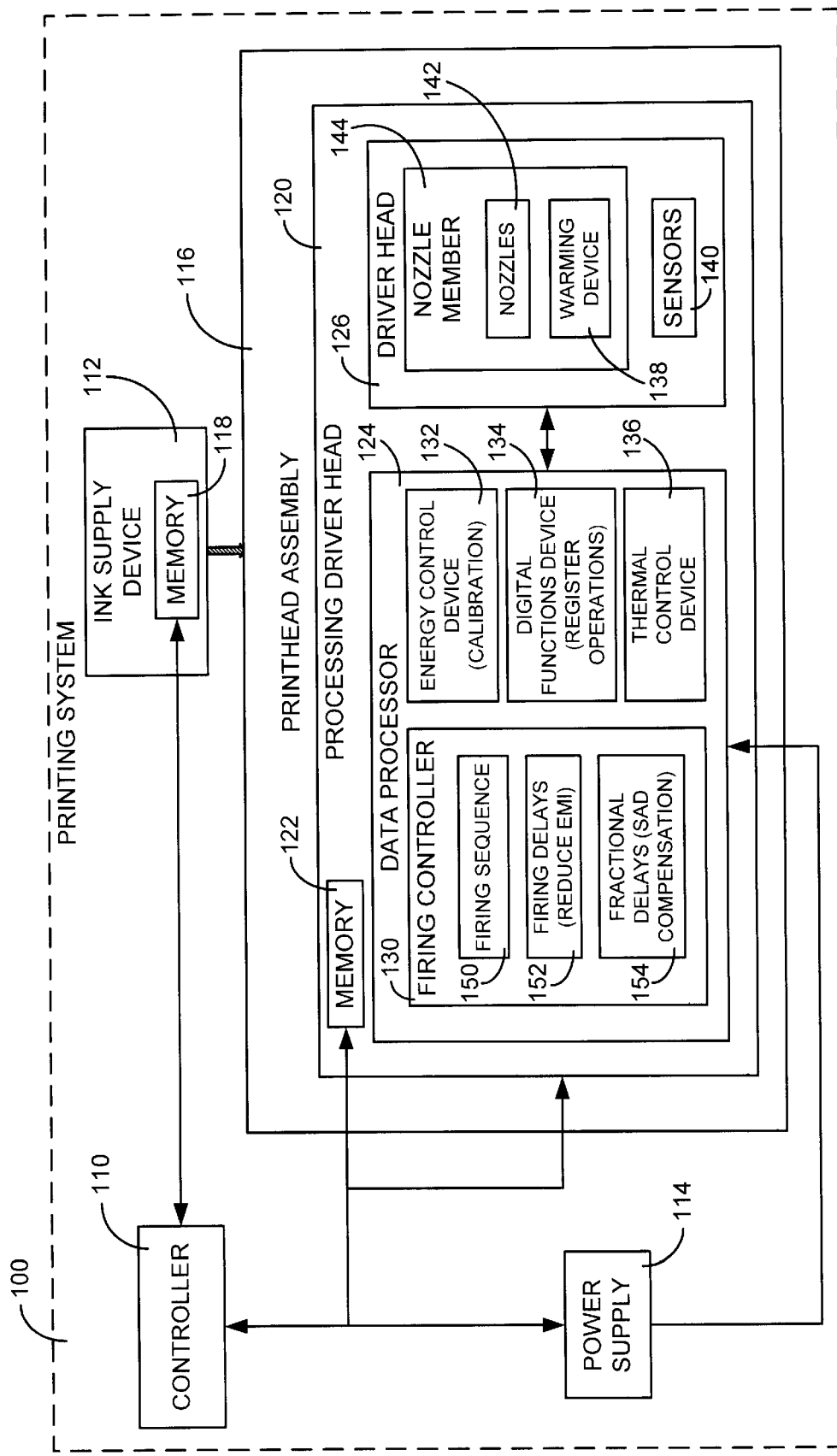
FIG. 1B shows a block diagram of an overall printing system incorporating the preferred embodiment of the present invention.

FIG. 1B shows a block diagram of an overall printing system 100 incorporating the preferred embodiment of the present invention. The data processor 124 of the present invention further includes a firing controller 130, an energy control device 132, a digital function device 134 and a thermal control device 136. The driver head 126 further includes a warming device 138 and sensors 140. Although the firing controller 130, energy control device 132, digital function device 134, thermal control device 136, warming device 138 and sensors 140 could be sub-components of other components, such as controller 110, in a preferred embodiment they are respective sub-components of the data processor 124 and the driver head 126, as shown FIG. 1B.

The firing controller 130 communicates with the controller 110 and the driver head 126 (in another embodiment it also communicates with the printhead assembly memory device 122) for regulating the firing of resistors of associated nozzles 142 of nozzle member 144. The firing controller 130 includes a firing sequence sub-controller 150 for selectively controlling the sequence of fire pulses, a firing delay sub-controller 152 for reducing electromagnetic interference (EMI) in the processing driver head 120 and a fractional delay sub-controller 154 for compensating for scan axis directionality (SAD) errors of the driver head 126.

The energy control device 132 communicates with the controller 110 and the sensors 140 of the driver head 126 for regulating the energy delivered to the driver head 126. Similarly, the thermal control device 136 communicates with the controller 110 and the sensors 140 and the warming device 138 of the driver head 126 for regulating the thermal characteristics of the driver head 126. The thermal control device 136 accomplishes this by activating the warming device 138 when the sensors 140 indicate that the driver head 126 is below a threshold temperature. In another embodiment, energy and thermal control devices 132, 136 also communicate with the printhead assembly memory device 122. The digital functions device 134 manages internal register operations and processing tasks of the data processor 124. The firing controller 130, energy control device 132, digital function device 134, thermal control device 136, warming device 138 and sensors 140 will be discussed in detail below.

Exemplary Printing System
Structural Components

Figure 2:
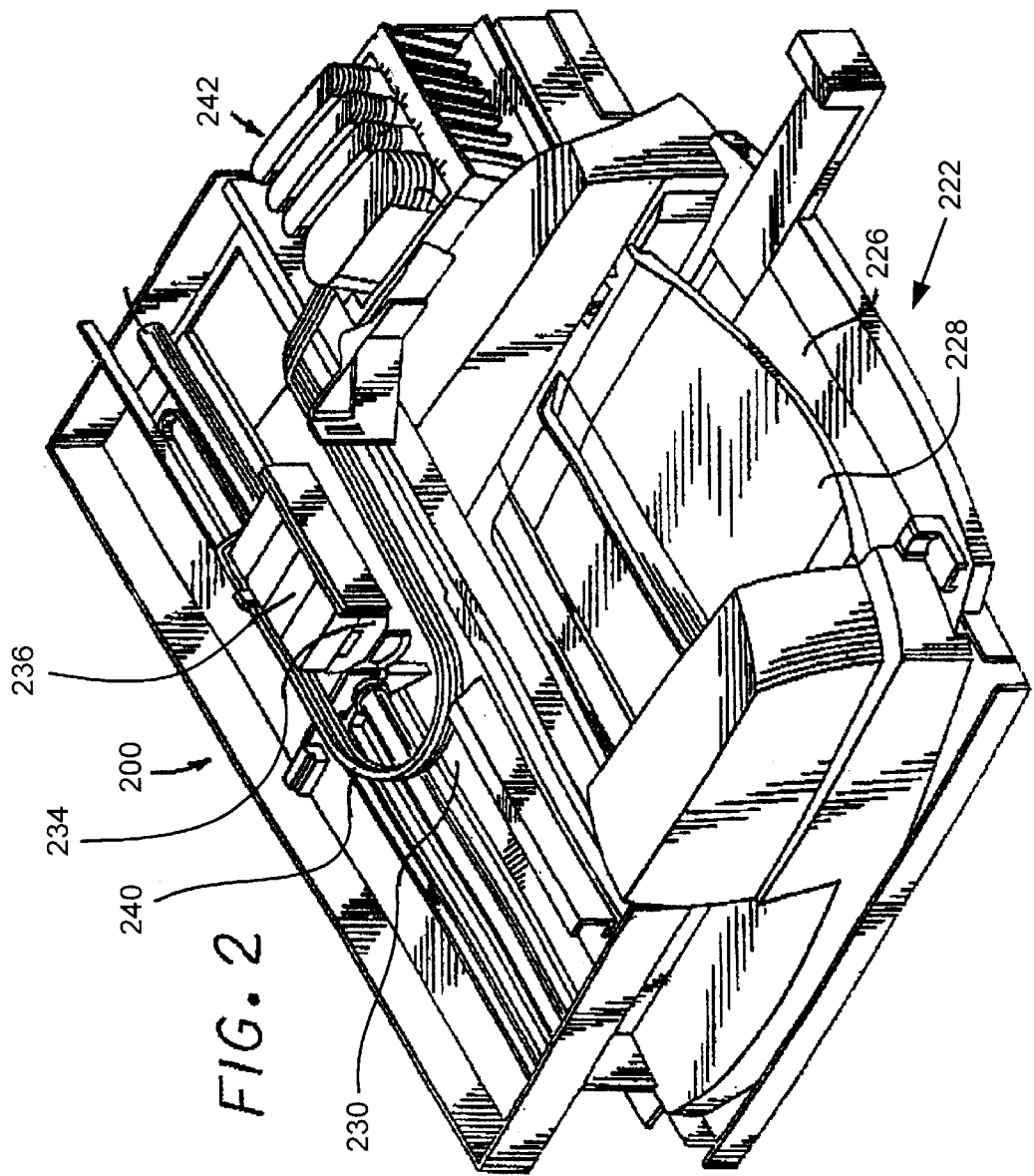
FIG. 2 is an exemplary printer that incorporates the invention and is shown for illustrative purposes only.

FIG. 2 is an exemplary high-speed printer that incorporates the invention and is shown for illustrative purposes only. Generally, printer 200 can incorporate the printing system 100 of FIG. 1A and further include a tray 222 for holding print media. When a printing operation is initiated, print media, such as paper, is fed into printer 200 from tray 222 preferably using a sheet feeder 226. The sheet then brought around in a U direction and travels in an opposite direction toward output tray 228. Other paper paths, such as a straight paper path, can also be used. The sheet is stopped in a print zone 230, and a scanning carriage 234, supporting one or more printhead assemblies 236 (an example of printhead assembly 116 of FIG. 1), is then scanned across the sheet for printing a swath of ink thereon. After a single scan or multiple scans, the sheet is then incrementally shifted using, for example, a stepper motor and feed rollers to a next position within the print zone 230. Carriage 234 again scans across the sheet for printing a next swath of ink. The process repeats until the entire sheet has been printed, at which point it is ejected into output tray 228.

The present invention is equally applicable to alternative printing systems (not shown) that utilize alternative media and/or printhead moving mechanisms, such as those incorporating grit wheel, roll feed or drum technology to support and move the print media relative to the printhead assemblies 236. With a grit wheel design, a grit wheel and pinch roller move the media back and forth along one axis while a carriage carrying one or more printhead assemblies scans past the media along an orthogonal axis. With a drum printer design, the media is mounted to a rotating drum that is rotated along one axis while a carriage carrying one or more printhead assemblies scans past the media along an orthogonal axis. In either the drum or grit wheel designs, the scanning is typically not done in a back and forth manner as is the case for the system depicted in FIG. 2.

The print assemblies 236 can be removeably mounted or permanently mounted to the scanning carriage 234. Also, the printhead assemblies 236 can have self-contained ink reservoirs (for example, the reservoir can be located within printhead body 304 of FIG. 3) as the ink supply 112 of FIG. 1. The self-contained ink reservoirs can be refilled with ink for reusing the print assemblies 236. Alternatively, each print cartridge 236 can be fluidically coupled, via a flexible conduit 240, to one of a plurality of fixed or removable ink containers 242 acting as the ink supply 112 of FIG. 1. As a further alternative, the ink supplies 112 can be one or more ink containers separate or separable from printhead assemblies 116 and removeably mountable to carriage 234.

Figure 3:
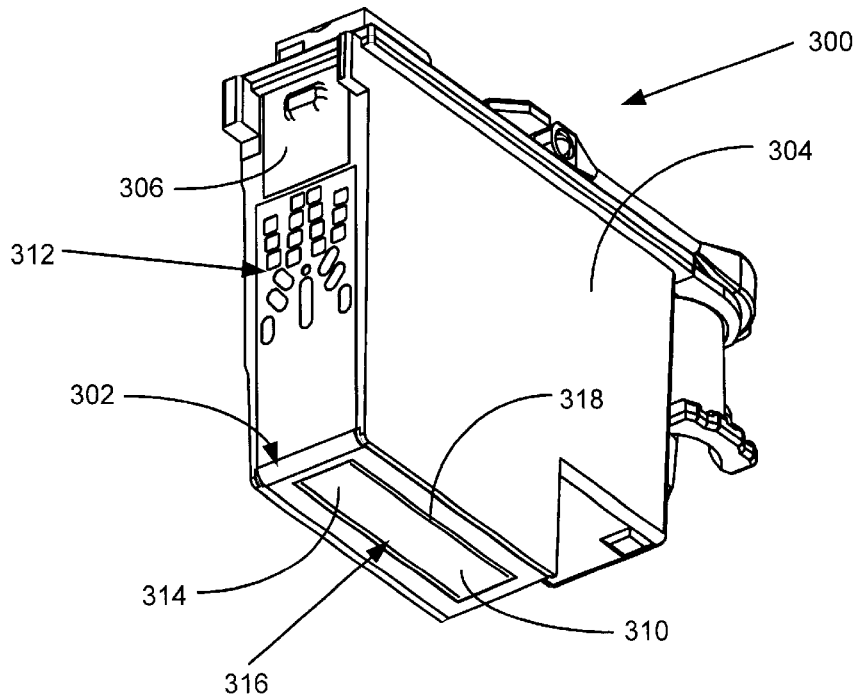
FIG. 3 shows for illustrative purposes only a perspective view of an exemplary print cartridge incorporating the present invention.

FIG. 3 shows for illustrative purposes only a perspective view of an exemplary printhead assembly 300 (an example of the printhead assembly 116 of FIG. 1) incorporating the present invention. A detailed description of the present invention follows with reference to a typical printhead assembly used with a typical printer, such as printer 200 of FIG. 2. However, the present invention can be incorporated in any printhead and printer configuration. Referring to FIGS. 1A and 2 along with FIG. 3, the printhead assembly 300 is comprised of a thermal inkjet head assembly 302, a printhead body 304 and a printhead memory device 306, which is an example of memory device 122 and discussed in detail in FIG. 5 below. The thermal head assembly 302 can be a flexible material commonly referred to as a Tape Automated Bonding (TAB) assembly and can contain a processing driver head 310 (an example of processing driver head 120 of FIG. 1) and interconnect contact pads 312. The interconnect contact pa(is 312 are suitably secured to the print cartridge 300, for example, by an adhesive material. The contact pads 308 align with and electrically contact electrodes (not shown) on carriage 234 of FIG. 2.

The processing driver head 310 comprises a distributive processor 314 an example of the data processor 124 of FIG. 1) preferably integrated with a nozzle member 316 (an example of driver head 126 of FIG. 1). The distributive processor 314 preferably includes digital circuitry and communicates via electrical signals with the controller 110, nozzle member 316 and various analog devices, such as temperature sensors (described in detail below), which can be located on the nozzle member 316. The distributive processor 314 processes the signals for precisely controlling firing, timing, thermal and energy aspects of the printhead assembly 300 and nozzle member 316. The nozzle member 316 preferably contains plural orifices or nozzles 318 which can be created by, for example, laser ablation, for creating ink drop generation on a print media.

Figure 4:
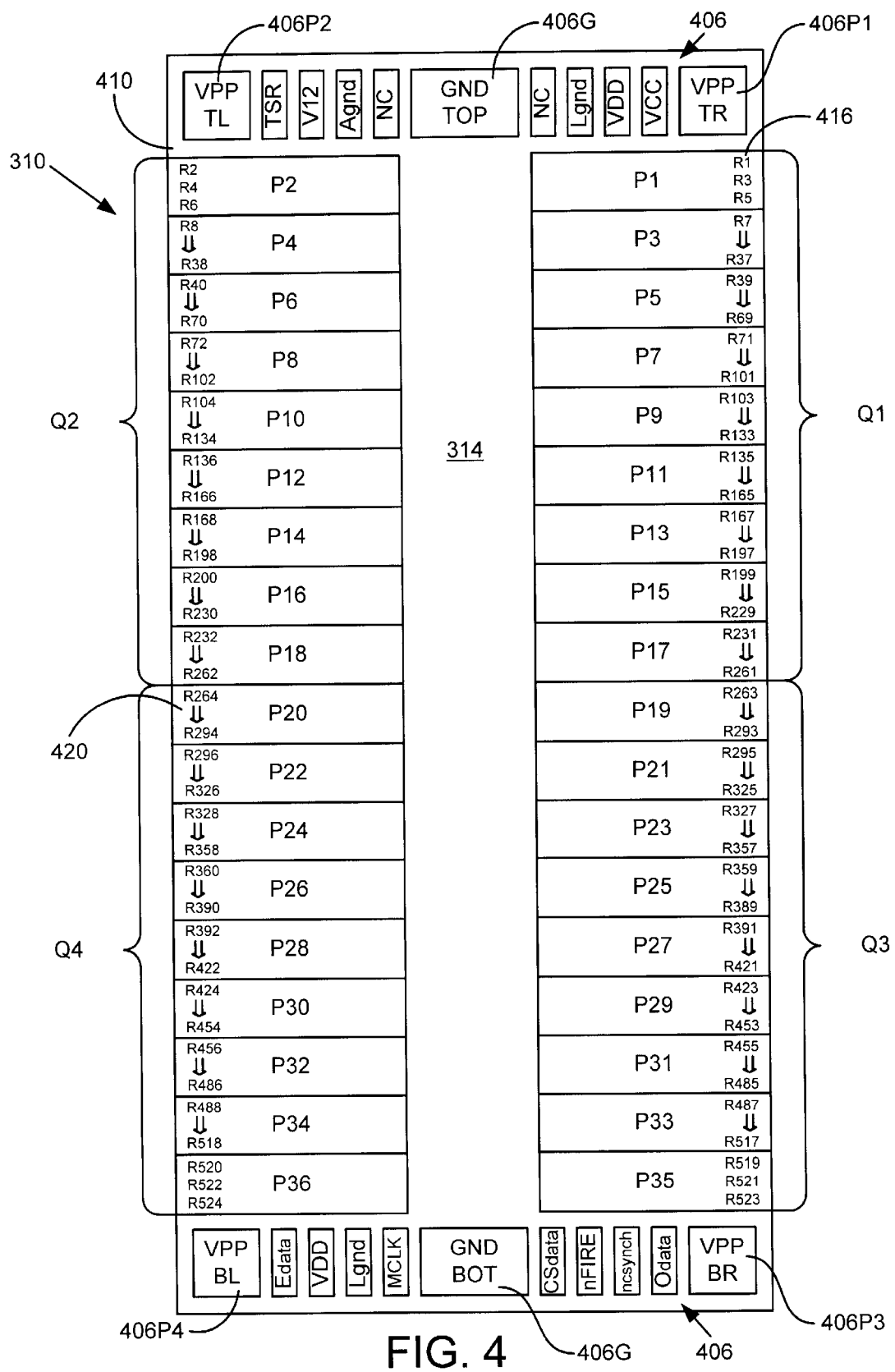
FIG. 4 is a detailed view of the integrated processing driver head of FIG. 4 showing the distributive processor and the driver head of the printhead assembly.

FIG. 4 is a detailed view of an exemplary integrated processing driver head of FIG. 3 showing the distributive processor and the driver head of the printhead assembly. The elements of FIG. 4 are not to scale and are exaggerated for simplification. Referring to FIGS. 1–3 along with FIG. 4, as discussed above, conductors (not shown) are formed on the back of thermal head assembly 302 and terminate in contact pads 312 for contacting electrodes on carriage 234. The electrodes on carriage 234 are coupled to the controller 110 and power supply 114 for providing communication with the thermal head assembly 302. The other ends of the conductors are bonded to the processing driver head 310 via terminals or electrodes 406 of a substrate 410. The substrate 410 has ink ejection elements 416 formed thereon and electrically coupled to the conductors. The controller 110 and distributive processor 314 provide the ink ejection elements 416 with operational electrical signals.

An ink ejection or vaporization chamber (not shown) is adjacent each ink ejection element 416 and preferably located behind a single nozzle 318 of the nozzle member 316. Also, a barrier layer (not shown) is formed on the surface of the substrate 410 near the vaporization chambers, preferably using photolithographic techniques, and can be a layer of photoresist or some other polymer. A portion of the barrier layer insulates the conductive traces from the underlying substrate 410.

Each ink ejection element 416 acts as ohmic heater when selectively energized by one or more pulses applied sequentially or simultaneously to one or more of the contact pads 312. The ink ejection elements 416 may be heater resistors or piezoelectric elements. The nozzles 318 may be of any size, number, and pattern, and the various figures are designed to simply and clearly show the features of the invention. The relative dimensions of the various features have been greatly adjusted for the sake of clarity.

As shown in FIG. 4, each ink ejection element 416 is a resistor. Each resistor 416 is allocated to a specific group of resistors, hereinafter referred to as a primitive 420. The processing driver head 310 may be arranged into any number of multiple subsections with each subsection having a particular number of primitives containing a particular number of resistors.

In the exemplary case of FIG. 4, the processing driver head 310 has 524 nozzles with 524 associated firing resistors. There are preferably thirty-six primitives in two columns of 18 primitives each. The center sixteen primitives in each column have 16 resistors each, while the two end primitives in each column have three resistors each. Thus, the sixteen center primitives have 512 resistors while the four end primitives have 12 resistors, thereby totaling the 524 resistors. The resistors on one side all have odd numbers, starting at the first resistor (R1) and continuing to the third resistor (R3), fifth resistor (R5) and so on. The resistors on the other side all have even numbers, starting at the second resistor (R2) and continuing to the fourth resistor (R4), sixth resistor (R6) and so on.

Consequently, the processing driver head 310 is arranged into four similar subsections or quadrants (Q1–Q4) with each quadrant having eight primitives (for example, Q1 has primitives P3–P17) of 16 resistors each and one primitive (P1) with three resistors (R1, R3, R5). When placed in the printer carriage 234, the printhead assembly is aligned such that the ink ejected from the second nozzle by R2 will print ink dots printed on the print media between ink dots printed by R1 and R3. Thus, in general, the ink dots printed by resistor N will fall on the print media between the ink dots printed by resistor N−1 and resistor N+1.

In a preferred embodiment, the processing driver head is also divided into power subsections for the purpose of power delivery to the resistors 416. Power pads 406PP among pads 406 are positioned for efficiently delivering power to the power subsections with minimum parasitic energy losses. In the exemplary embodiment depicted by FIG. 4, each of quadrants Q1 through Q4 is a power subsection, with power pads 406PP1 to 406PP4 providing power to quadrants Q1 to Q4, respectively. By positioning the power pads 406PP at the four corners (in close proximity or proximate to the power subsections) of the substrate, the power losses through connecting power traces is minimized. Preferably the power pads 406PP are widened to for the conduction of relatively high current levels. Preferably even wider ground pads 406G are provided for the return current from the power subsections, with a ground pad located between power pads 406PP1 and 406PP2 carrying return current for quadrants Q1 and Q2 and the other ground pad located between power pads 406PP3 and 406 PP4 carrying return current for quadrants Q3 and Q4. Of course, other power distribution arrangements are possible, such as combining pads 406P1 and 406 P2 into one pad, changing the size of the subsections that are powered by particular power pads, etc.

In one embodiment, within each center sixteen nozzle primitive there is a micro stagger, such as 3.75 microns. In other words, the first nozzle of a particular primitive is 3.75 microns closer to the center of the head 310 than the last nozzle in the particular primitive. This allows the firing cycle to complete and allows margin for jitter. Jitter is timing error of encoder pulses associated with carriage 234 vibration. The micro stagger enables the printhead assembly 116 to fire all nozzles in a primitive in roughly 90% of the firing cycle, thereby leaving approximately a 10% jitter margin.

In the example processing driver head 310 of FIG. 4, this micro stagger produces 512 resistors that are slanted or skewed. As a result, the printhead assembly is preferably rotated with respect to the paper axis to compensate for the skewed resistors. In non-skewed printhead assemblies, the printhead assemblies are aligned with the printhead assembly axis parallel to the print media axis. In contrast, in this embodiment, the printhead assembly 116 is suitably rotated (for a 3.75 micro stagger, the rotation is preferably arctan 1/32 or 1.79 degrees).

Consequently, when the printhead assembly with micro staggered resistors is inserted into the carriage 234, it will be tilted such that a vertical column printed by a stationary printhead is skewed by 1.79 degrees from vertical. Since it is desirable to print a vertical line with a moving slanted printhead, the resistors must be fired in a sequence with the leading resistors in each column firing first. As the printhead moves back and forth across the print media, the resistor that is leading will subsequently change, and hence the firing sequence changes. The firing sequence is controlled by the controller and processing driver head and will be discussed in detail below.

Operation and Function

Figure 5:
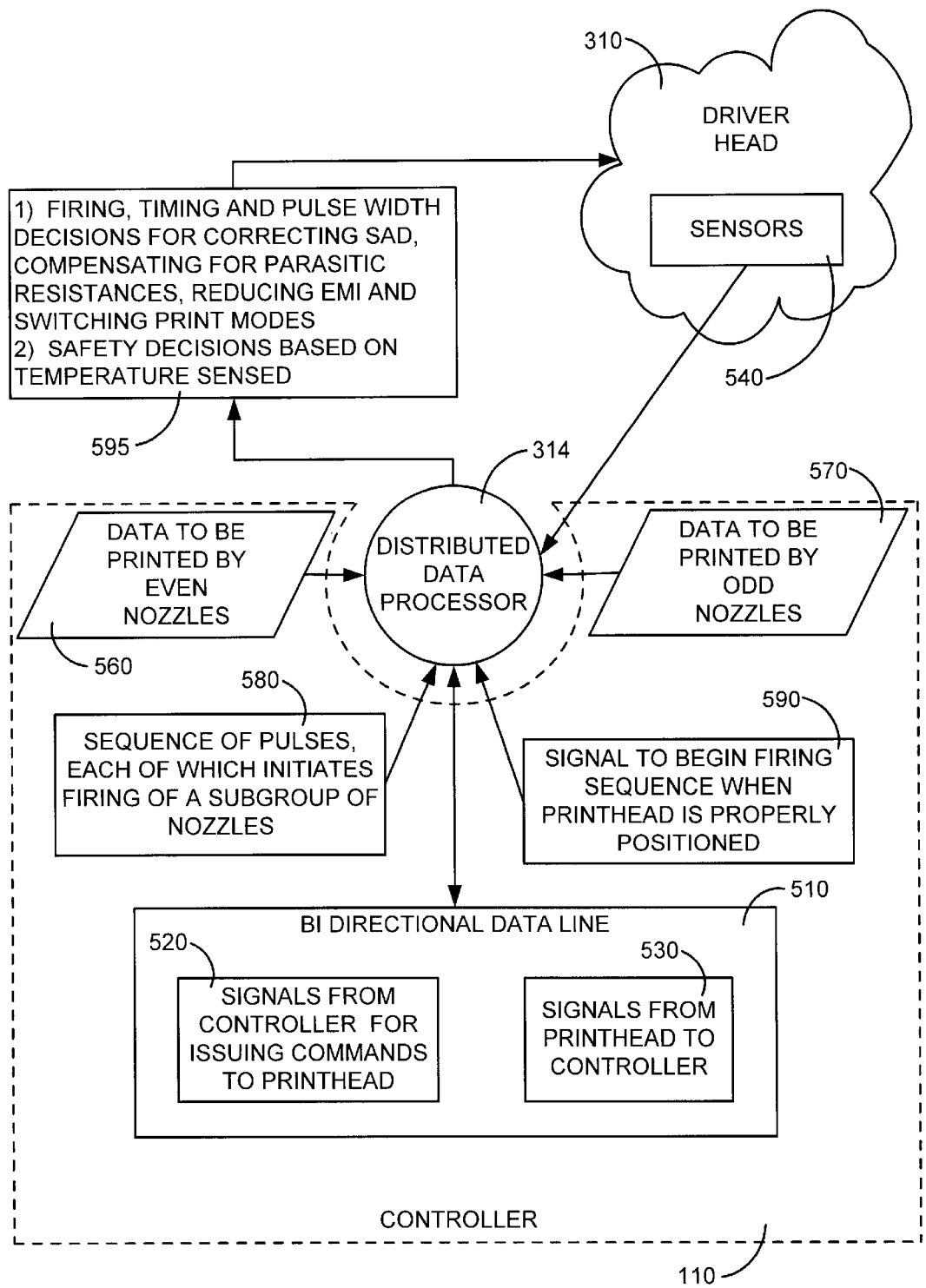
FIG. 5 is a block diagram illustrating the interaction between the distributive processor and the driver head of the printhead assembly.

FIG. 5 is a block diagram illustrating the interaction between the distributive processor and the other systems of the printing system. The distributive processor 314 communicates with the controller in a bi-directional manner over a bi-directional data line (box 510). The controller sends commands to the distributive processor (box 520) and receives and processes signals, such as status signals, from the distributive processor (box 530). The distributive processor 314 also receives sensor signals from sensors 540 located on the driver head 310. The sensors can also be connected to the controller via a direct connection or through the printer's memory device for continuously updating the controller. In addition, the controller sends the printhead assembly organizational data over different channels (boxes 560 and 570), such as even and odd nozzle data, respectively. Further, a firing sequence for firing the nozzles (for example, enable signals) is received by the distributive processor (box 580), as well as a signal to begin this firing sequence (for example, a fire signal) (box 590).

The distributive processor 314 makes decisions and actions based on its input signals. For example, firing, timing and pulse width decisions are made by the distributive processor for correcting scan axis directionality errors, compensating for parasitic resistances, reducing electromagnetic interference and intelligently switching between print modes.

Figure 6:
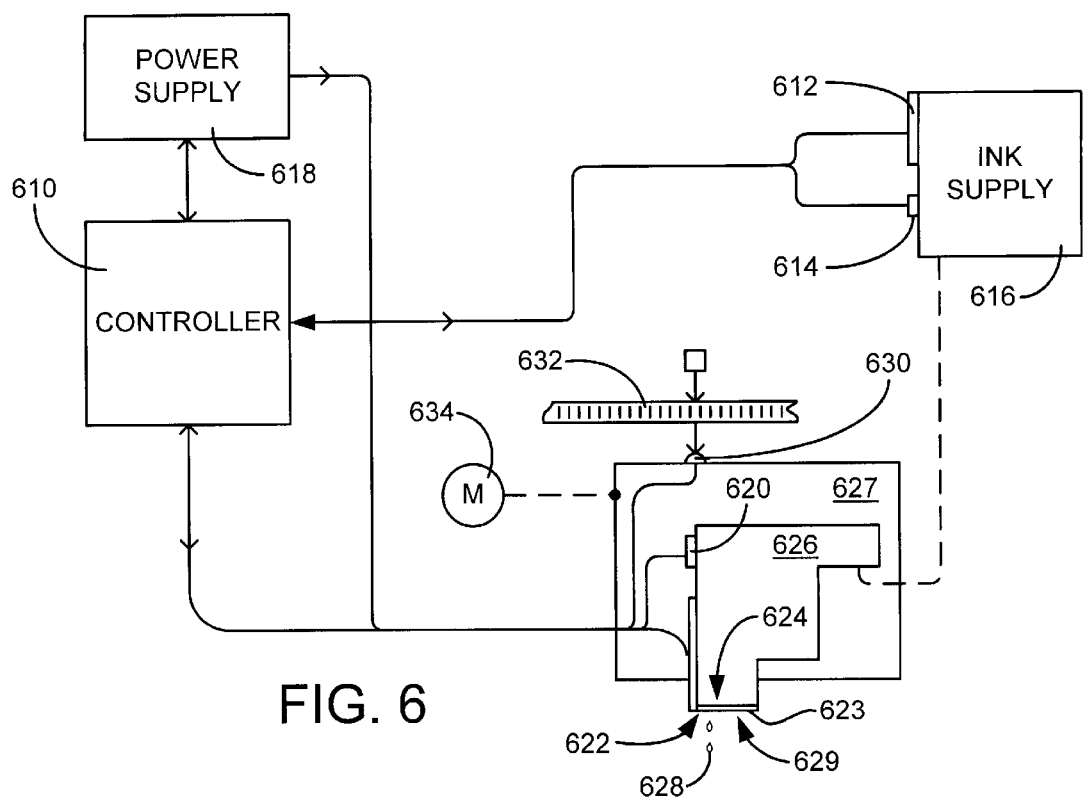
FIG. 6 is a block diagram illustrating the overall functional interaction between the components of the printing system.

FIG. 6 is a schematic diagram illustrating the overall functional and interaction between the components of FIGS. 3–4 operating in an exemplary printing environment. A printer controller 610 is coupled to a memory device 612 and an ink level sensor 614 of an ink supply device 616, a power supply 618, a memory device 620, a processing driver head 622 and sensors 623 of a printhead assembly 626, a printhead carriage 627 and an encoder strip 632 via a detector 630.

The ink supply device 616 is fluidically coupled to the printhead assembly 620 for selectively providing ink to the printhead assembly 620. The processing driver head 622 is comprised of a data processor 624, such as a distributive processor, and a driver head 629, such as an array of inkjet nozzles or drop generators for ejecting ink drops 628. The sensors 623 can be temperature sensors (discussed in detail below) for controlling the energy delivered to, and the temperature of, the printhead assembly 626. The detector 630 detects a position of printhead assembly 626 and printhead carriage 627 relative to the encoder strip 632, formulates position signals and sends the position signals to the controller for indicating an exact relative position of the printhead assembly 626. A transport motor 634 is coupled to the controller 610 and the printhead assembly 626 for positioning and scanning the printhead assembly 626.

During operation of the printing system 600, the power supply 618 provides a controlled voltage or voltages to the printer controller 610 and the processing driver head 622. The data processor 624 can communicate with the controller 610 in a bi-directional manner with serial data communications. The bi-directional communication enables the data processor 624 to dynamically formulate and perform its own firing and timing operations based on sensed and given operating information for regulating the temperature of, and the energy delivered to the printhead assembly 626. These formulated decisions are based on printhead temperatures sensed by the sensors 623, sensed amount of power supplied, real time tests, and preprogrammed known optimal operating ranges, such as temperature and energy ranges, scan axis directionality errors, etc. Moreover, serial communications allows the addition of nozzles without the inherent need to increase leads and interconnections. This reduces the expense and the complexity of providing internal communications for the printhead assembly 626.

Component Details

The printhead assembly of the present invention includes both complex analog and digital devices (such as microelectronic circuitry) communicating with the distributive processor. Communication between the digital and analog devices and the distributive processor allows proper control and monitoring of the processing driver head, such as enabling tests to be performed, sensed data to be interpreted, and the processing driver head to be calibrated, among other things. For instance, the distributive processor of the printhead assembly can receive stored or sensed data from other devices for controlling and regulating fire pulse characteristics, register addressing (as well as the loacing of fire data into these registers), error correction of ink drop trajectory, processing driver head temperature, electromagnetic interference, nozzle energy, optimal operating voltage and other electrical testing of the printhead assembly.

Electrical Testing

In order to ensure optimal performance of the printhead assembly, one of the functions that the distributive processor can perform is electrical testing. Types of electrical tests include continuity testing, short testing and determination of proper energy levels within the printhead assembly. Preferably, this electrical testing is performed prior to operation of the printhead assembly in order to verify that the system is within acceptable tolerances. Electrical testing ensures that full control of the printhead assembly can be maintained and prevents unpredictable behavior and possible damage to the printhead assembly and printing system. For example, if proper electrical connections are not maintained between the signal pad and the printing system the printhead assembly will behave unpredictably and may lead to uncontrolled nozzle firing.

Figure 7:
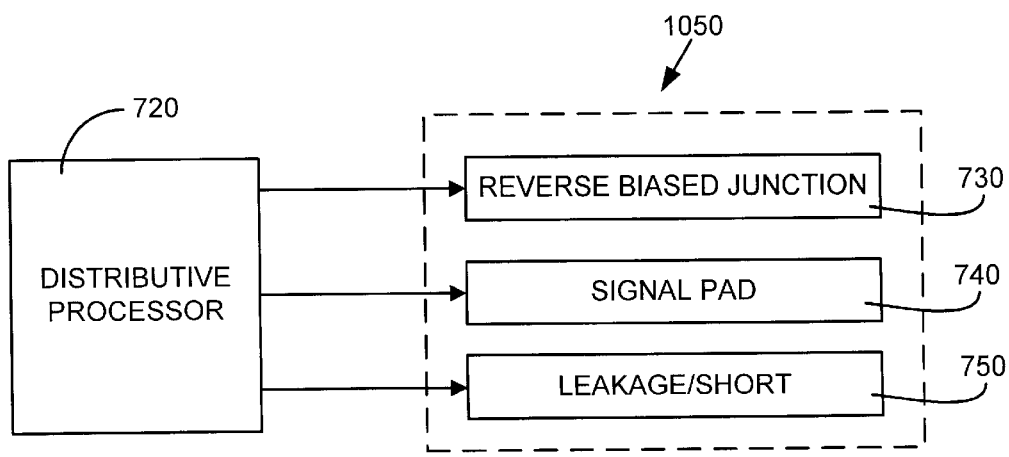
FIG. 7 is an overview block diagram of continuity testing.

As shown in FIG. 7, various types of electrical testing of the printhead assembly 710 are facilitated by the distributive processor 720. Process 730 is continuity testing of the printhead assembly 710 using reverse biased junctions. Process 740 is continuity testing of the signal pad contained on the processing driver head (not shown). Further, process 750 is testing for leaks and shorts within the printhead assembly. Each of these processes are discussed further below.

Continuity Testing

One type of electrical testing that may be performed by the distributive processor is continuity testing of electrical connections. Continuity testing examines the electrical path between components to make sure that the path is not disrupted or damaged and that no intermittent connections exist. If certain connections were to become disconnected before the resistor power was turned off, then full power could be delivered to the resistors for extended periods. This situation could permanently damage the resistors. Intermittent and loose connections can be caused by mechanical vibrations of the printing system or when papers jams displace the printhead assembly body off the interconnects with the printing system. Therefore, it is important to perform tests that determine acceptable continuity between components so that electrical signals will properly travel over the connections.

As shown in FIG. 7, process 740, one type of continuity testing that the present invention can perform, is built-in signal pad continuity testing. The signal pads are electrical connections that interconnect components of the printing system and the printhead assembly.

Referring back to FIG. 4 along with FIG. 7, a working example of built-in signal pad continuity testing is exemplified. In this example, the processing driver head 314 has a plurality of nozzles 416 located within sectional areas Q1, Q2, Q3, Q4 of the processing driver head 314, such as on opposite sides of the processing driver head 314. One side can be labeled with even numbered nozzles and the opposite side with odd numbered nozzles. In addition, the processing driver head 314 can have top and bottom interconnect pads 406. Each individual pad within the interconnect pads 406, with the exception of logic ground pads, are connected to a substrate through N/P semiconductor junctions. The logic ground pads have ohmic contacts to the substrate.

The printhead assembly can be divided into sections, groups or sets, with each section, group or set typically including a plurality of nozzles 416. The power required to eject ink drop from these nozzles 416 is delivered to each section through the signal pads. After the power has been delivered to each section the power circuit is completed by routing the power to ground through ground pads.

The bottom interconnect pad of the integrated processing driver head contains plural signal pads whose continuity may be tested to ensure proper operation. These signal pads can include (from left to right) a data input pad for even nozzle data (EDATA pad), a master clock input pad (MCLK pad), a command/status data input/output pad (CSDATA pad), a resistor fire pulse input pad (nFIRE pad), a column synchronization signal input pad (nCSYNCH pad) and an data input pad for odd nozzle data (ODATA pad).

Figure 8:
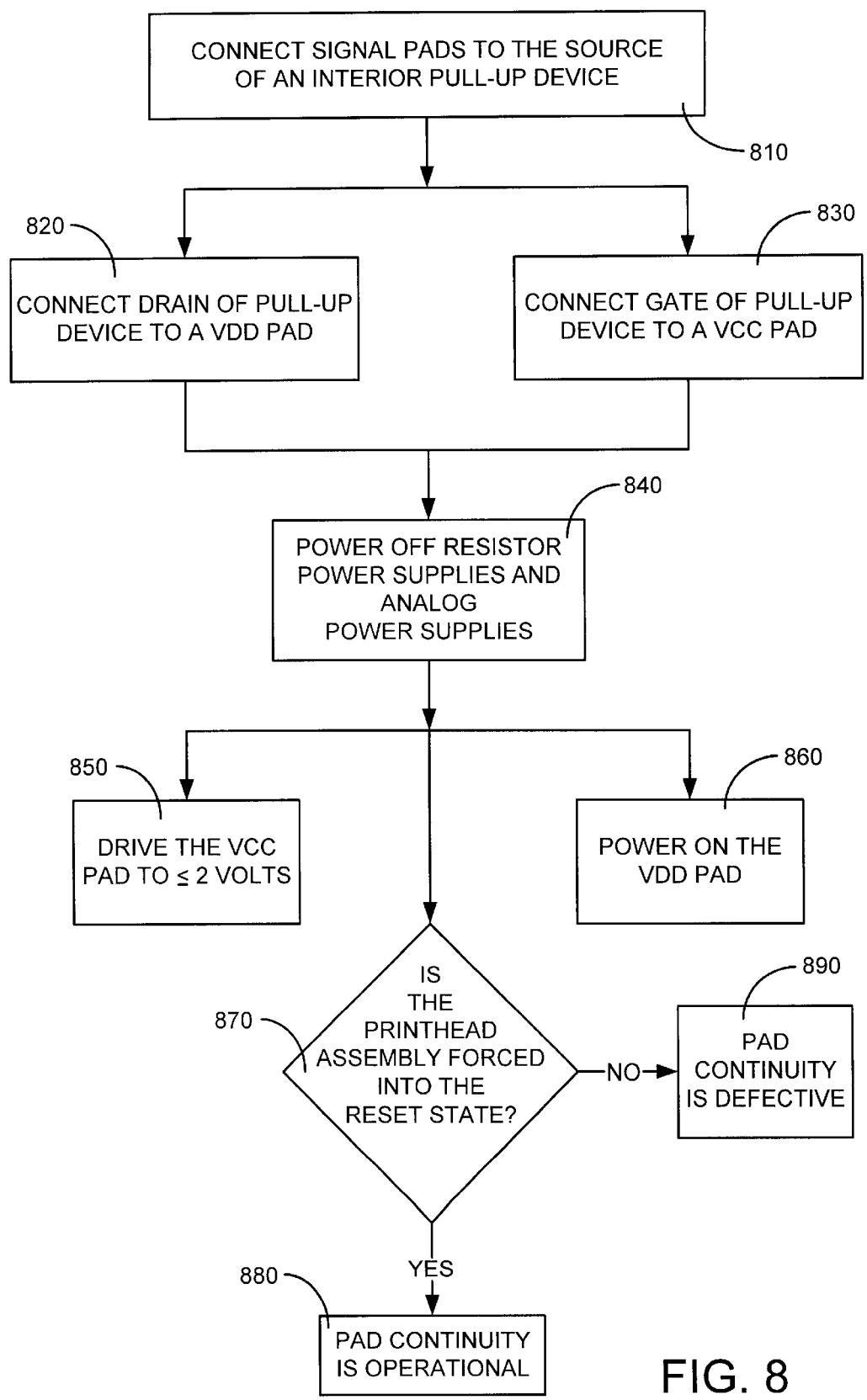
FIG. 8 is a flow diagram of the continuity testing of specific signal pads on the interconnect pad.

FIG. 8 is a flow diagram of the continuity testing of the six signal pads located on the bottom interconnect pad. In process 810, each of these six signal pads is connected to the source of an internal semiconductor device, such as a PMOS pull-up device. Process 820 connects the drain of this pull-up device to a VDD pad (5-volt logic supply) and process 830 connects the gate of the pull-up device to a VCC pad (12-volt supply for the transistor gate voltage). As noted earlier, the advantage this arrangement is that limited continuity testing on the signal pads may be performed without the need for a negative supply voltage.

Continuity testing is effected in process 840 by first turning off the power supplies to the resistors. As shown in FIG. 4, there are four pads on the printhead assembly that supply power to the resistors. Located at the top interconnect pad are a $VPP_{TL}$ pad (resistor power supply pad for even primitives 2 through 18) and a $VPP_{TR}$ pad (resistor power supply pad for odd primitives 1 through 17). Similarly situated at the bottom interconnect pad are a $VPP_{BL}$ pad (resistor power supply pad for even primitives 20 through 36) and a $VPP_{BR}$ pad (resistor power supply pad for odd primitives 19–35). In addition, any analog power supplies such as a V12 pad (12-volt clean power supply for the analog circuitry) located at the top interconnect pad (shown in FIG. 4) must be turned off. Turning off both the resistor and analog power supplies avoid any damage to the printhead assembly in case of contact with a defective electrical connection.

In process 850 a VCC pad (12-volt logic supply) is driven to 2 volts or lower (with ground preferred). The VDD supply is turned on in process 860 and the pull-ups are then operational. All of the inputs to the six signal pads are pulled low externally in process 870 to test whether the printhead assembly will reset. Assuming proper continuity the printhead assembly will be forced into the reset state in process 880 and this indicates that the pad continuity is acceptable. However, if the printhead assembly is not forced into the reset state, as in process 890, then the pad continuity is faulty and repairs must be made prior to the operation of the printhead assembly. Each pull-up device will source a maximum of 2.75 milliamps when a respective pad is pulled low and each pull-up will drive a 100 picoFarad capacitive load from 0-volts to 4-volts in a maximum of 1.0 microsecond. In normal printhead assembly operation the VCC pad will be at 12-volts and all of the signal pad pull-up devices will be off.

As shown in FIG. 7, process 730, another type of continuity testing that the present invention can perform is reverse biased junctions continuity testing. In general, reverse biasing occurs when a voltage, applied to a junction to be tested, has a polarity such that the current at the junction is close or equal to zero. Typically, most of the signal pads are connected to ground through semiconductor junctions. As such, the continuity of the signal pads is tested by reverse biasing the pads and analyzing the voltage and current flow through the junction. If continuity is present, the junction will forward bias and the current will increase. If, however, the electrical path has been disrupted no current will flow through the junction.

As an example, first, all pads on the printhead assembly can be grounded. In this example, most of the pads on the printhead assembly are connected to a substrate through N/P semiconductor junctions. Normal operation provides reverse biasing for the semiconductor junctions because the substrate is the ground (the lowest potential) on the printhead assembly.

The continuity of each pad can be tested by bringing each pad to a negative voltage (for example, lower than −1 volt), while the current in the pad is limited to a minimum sensitivity of a current measuring device. In this example, the minimum current is 100 microamps. Continuity is present in a pad when the semiconductor junction forward biased and supplied greater than 100 microamps. In contrast, pads with an open connection not having current flowing through the junction, indicates that the electrical path of that circuit is disrupted.

Leakage/Short Testing

As shown in FIG. 7, process 750, another type of testing that may be performed by the distributive processor is leakage/short testing. Shorts can occur if the ink is allowed to connect two or more conductors together. This may occur outside the printhead assembly at connection points between the printhead assembly and the printing system, on the printing system flex circuit, the printhead assembly flex circuit or within the printhead assembly as a result of a materials failure. The processing driver head power supply can delivery large amounts of power, and thus, an ink short can damage the printing system and even cause a fire hazard. Therefore, it is critical to prevent and detect any electrical leakage and shorts within the printhead assembly and at the printhead assembly/printing system interfaces.

A preferred embodiment of the invention includes a testing for leakage and shorts during and after insertion of the printhead assembly into the printing system and at the time printhead assembly is turned on. This testing checks for leakage and shorts in, for example, power leads, ground lead and digital lines.

Figure 9:
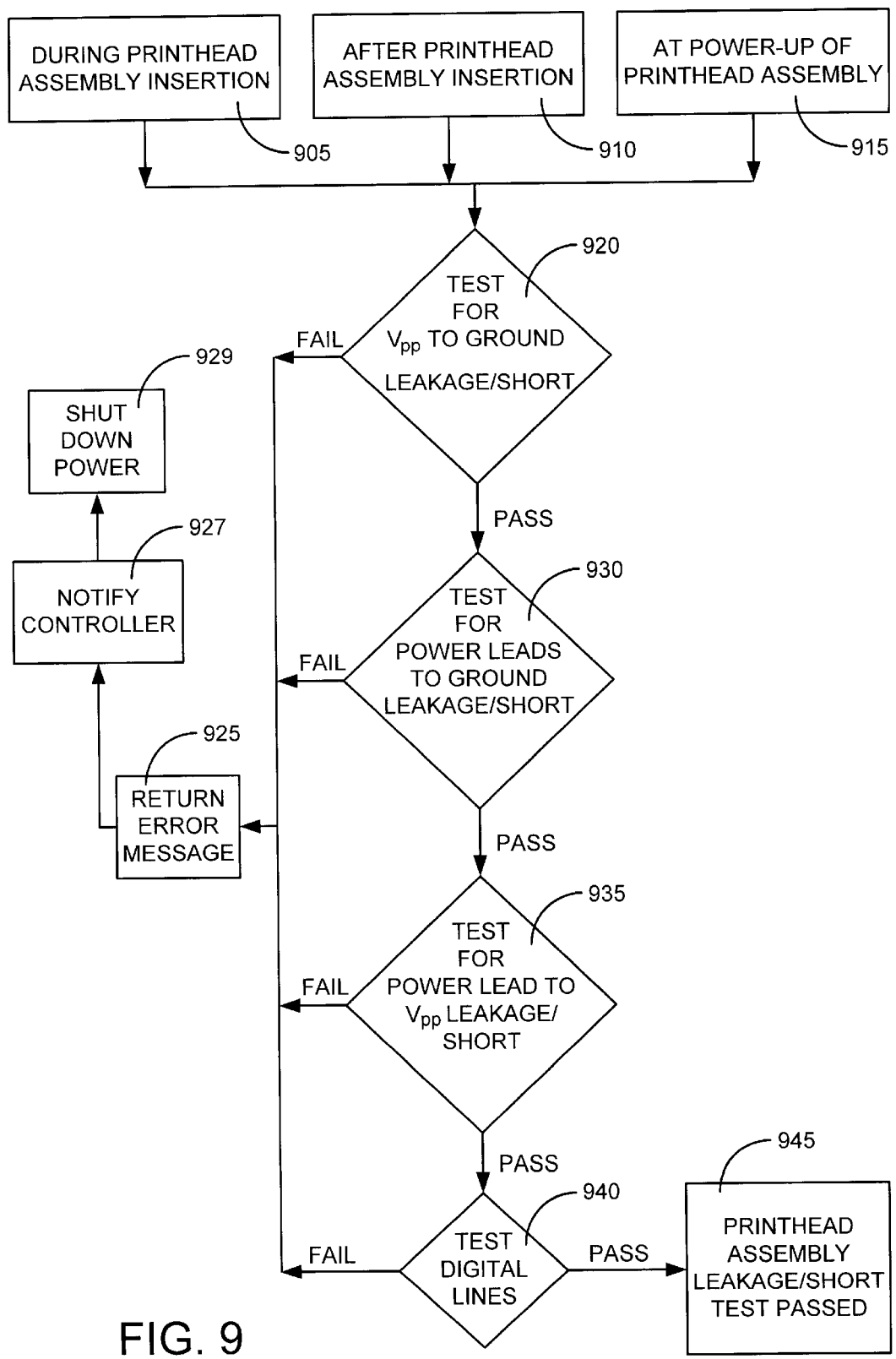
FIG. 9 is a functional block diagram of a working example of leakage/short testing.

FIG. 9 is a functional block diagram of a working example of leakage/short testing. Process 905 shows that testing occurs during the insertion of the printhead assembly into the printing system, process 910 shows that testing also occurs after insertion and process 915 shows that testing occurs whenever the system is turned on. Although FIG. 9 shows the following processes occurring in a particular order it should be noted that they may occur in any order and even simultaneously. Process 920 tests the power pad supply voltage ($V_{pp}$) to ground. Process 920 is looking for an out of regulation condition in the feedback line of $V_{pp}$. If an out of regulation condition is found the test is failed and, in this example, process 925 returns an error message to the printing system and the controller is notified 927 and the power is preferably shut down 929. If the test is passed, the next test is run.

Process 930 tests for power leads to ground leakage and shorts. In this example, the printhead assembly has a 5-volt and a 12-volt power lead coming from linear regulators. If any leakage or short is detected process 925 returns an error message. Otherwise, process 935 begins testing the power lead to $V_{pp}$ connection to make sure that no leakage or short exist. Once again, if this is failed process 925 returns an error message and if the test is passed the next test is performed.

Process 940 performs testing of the digital lines within the printhead assembly. The severity of this type of short is difficult to define because the leakage current and the amount of lines shorted together need to be known. However, a threshold value is defined and this value is compared to the resistance that is found by process 940. If the measured valued exceeds the threshold value the test is failed and process 925 returns an error message. Otherwise, process 945 indicates that the leakage/short test has been passed.

Leakage/short testing may be also be implemented such that when an error is detected the distributive processor or controller automatically shuts down power to the printhead assembly. This type of implementation helps protect the printing system from the leakage and shorts of the printhead assembly. In addition, in multiple printhead assembly applications this testing can be implemented to determine which printhead assembly is bad. Thus, if a print process is canceled because of a bad printhead assembly the printing system will be notified as to which printhead assembly cause the problem.

II. ENERGY LEVEL DETERMINATION

The distributive processor may also determine the proper operating energy levels for the printhead assembly. Several components and systems within the printhead assembly have a minimum operating as well as a maximum operating temperatures and voltages, and the distributive processor helps to maintain the printhead assembly within these boundaries. Maximum operating temperatures are established assure printhead reliability and avoid print quality defects. Similarly, maximum power supply voltages are established to maximize printhead life.

One type of energy level determination is the determination of the operating voltage of the printhead assembly. Preferably, the operating voltage is determined at the time of manufacture and is encoded in the assembly memory device. However, after the printhead assembly is installed in a printing system a somewhat higher power supply voltage is required in order to deliver the proper operating voltage to the printhead assembly because of additional parasitic resistance introduced by connection to the printing system. This voltage must be high enough to supply the proper voltage to the printhead assembly but be below the maximum power supply voltage. Thus, it is important that the power supply voltage be adjustable in the printer.

The optimal operating voltage is determined by first finding the turn-on energy (TOE) of the printhead assembly. The TOE is the amount of energy that is just adequate to cause drop ejection from the nozzles of the printhead assembly. At the time manufacture the TOE is determined by applying a high amount of energy and observing a drop ejection. The TOE is then gradually reduced until drop ejection ceases. The TOE point is that energy just above the point where drop ejection ceases. This TOE together with an over energy margin is then used to find the operating voltage and this voltage is written to the printhead assembly memory device.

In a preferred embodiment the optimal operating voltage is adjusted so as to achieve an energy level approximately 20% over the turn-on energy (TOE). This energy level is given by:

$$\text{Energy} = \text{power} * \text{time}$$

where the pulse width of the fire pulse is the measure of time. The power is given by:

$$\text{power} = V^2/r$$

where r=resistance of the printhead assembly and V=operating voltage. In this example by setting the energy value equal to 20% greater than the TOE the optimal operating voltage may be found.

Resistor Firing

The distributive processor of the present invention controls some firing sequences of the resistors. This arrangement allows the distributive processor to rearrange and parse data and fire pulses to optimize the ink ejection process under a variety of conditions. Some of the operations that can be controlled and varied according to the conditions are: (a) the firing sequence of the fire pulses; (b) firing delay circuitry (to reduce electromagnetic interference); (c) input data to the nozzles; and fractional dot delays (to reduce the effects of scan axis directionality errors).

Resistor Firing Sequence

Figure 10:
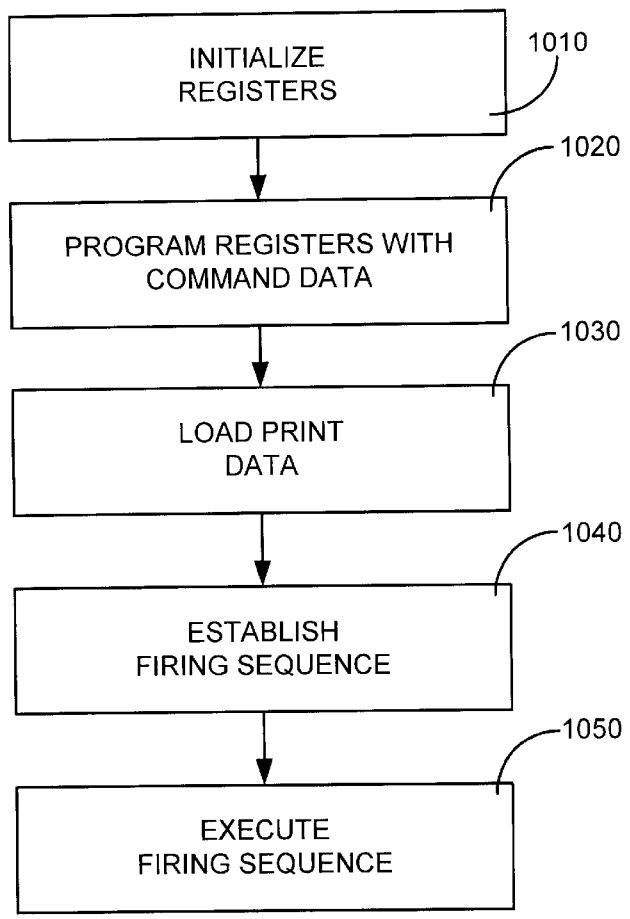
FIG. 10 is an overview block diagram of the resistor firing operation.

FIG. 10 is an overview flow chart of the resistor firing operation. In process 1010 the registers are first initialized prior to loading them with data. This clears the register memory so that new firing data can be loaded. Process 1020 programs the registers with command data. This command data may include any type of data that enables the printhead assembly to control the firing of the resistors. For example, command data may include maximum allowable nozzle temperature, energy controlled setpoint information and sequencing and addressing information. After the registers are programmed with the command data process 1030 begins loading the print data into the registers.

In process 1040 the firing sequence is established. Numerous firing sequences are possible for each primitive since each sequence is based on completely independent variables. As discussed above, a primitive is a grouping of resistors. In general at least four independent variables are used permitting at least 256 possible firing sequences for each primitive. Process 1040 also includes loading each nozzle firing sequence into the registers and is discussed further below. After the firing sequence has been loaded process 1050 executes the firing sequence and begins the actual printing process.

Although the number and type of independent variables for the firing sequence may differ between printing systems and print processes, one embodiment of the invention includes four variables including a mode variable, an address count start variable, a direction variable and a fractional delay variable. The mode variable alerts the printhead assembly to what type of resolution is required of the print process. As an example, the mode variable may have two options of a 600 dpi (dots per inch) node and a 1200 dpi mode. Using the current temperature sensed, a thermal response model of the printhead assembly and a maximum permissible processing driver head temperature (which can be located in the printhead assembly memory device or the printer), the controller determines whether the printing operation in the selected mode will keep the printing parameters (such as temperature) within an acceptable range.

If not, then the mode variable can be switched to a suitable print mode. One unique feature of the invention is that changing a firing sequence in a primitive only requires changing the sequence in which addresses are generated. For example, the address start variable notifies the printhead assembly where to find the register to be accessed. Preferably the addresses are incremented such that they are adjacent each other and the address start variable may be any address desired. By changing the starting address the firing sequence also can be changed. If, for example, each nozzle has a fixed 4-bit address with the top resistor in each primitive having an address of "0" and the bottom resistor having an address of "15", simply changing the starting address variable would result in the generation of a different firing sequence. The ability to choose the firing sequence provides control over vertical alignment and switching print modes.

The firing sequence may also be changed by the direction variable. This variable tells the printhead assembly which side of the printhead assembly is leading as the printhead assembly scans back and forth across the page. For example, in a preferred embodiment nozzles are divided into an even and an odd side and the direction variable equals "0" if the odd nozzle is on the leading edge and set to "1" if the even nozzle is on the leading edge of the printhead assembly.

Fire Pulse Delay

Consistent advances in printhead design now permit more ink-firing nozzles to be implemented on a single printhead. This increase in the number of nozzles has increased swath width, and therefore print speed. As the number of nozzles is increased, however, problems arise when nozzles are triggered so that an ink drop is ejected ("firing"). The firing of each nozzle requires the switching on and off of a large amount of electrical current in a short amount of time. This "switching" (referring to the switching off and on of the nozzle current) of a large number of nozzles simultaneously generates undesirable electromagnetic radiation interference (EMI). The EMI generated by nozzle switching causes the wiring within the printing system to act as an antenna. EMI is undesirable because it interferes with internal components of the printing system and other electric devices and appliances not associated with the printing system (e.g. computers, radios and television sets). This interference with other systems also can hamper approval from regulatory agencies (e.g. the Federal Communications Commission (FCC)) that set electrical emission standards for electric devices.

The present invention reduces unwanted EMI without increasing system cost and without adding system constraints. The invention accomplishes this by staggering over time the switching of nozzles within the printhead assembly. Because fewer nozzles are being switched off and on at any given time, EMI is reduced without the disadvantages of existing EMI reduction methods.

In one embodiment, the distributive processor and a delay device (e.g. an analog delay) are used to provide the delay. A fire pulse, which is composed of a fire signal (a signal commanding the nozzle to eject an ink drop) and an enabling signal (a signal containing at least one pulse for instructing the nozzle how long to switch on) is routed through the delay device. The printhead assembly is divided into sections (each section containing a number of primitives) and each primitive (except the first primitive) has a delay device that the fire pulse and enable pulse must go through. In order to further reduce EMI the present invention also uses an additional delay called ar intersectional delay. This intersectional delay delays the fire pulse an additional amount before the pulse is passed between sections.

Figure 11:
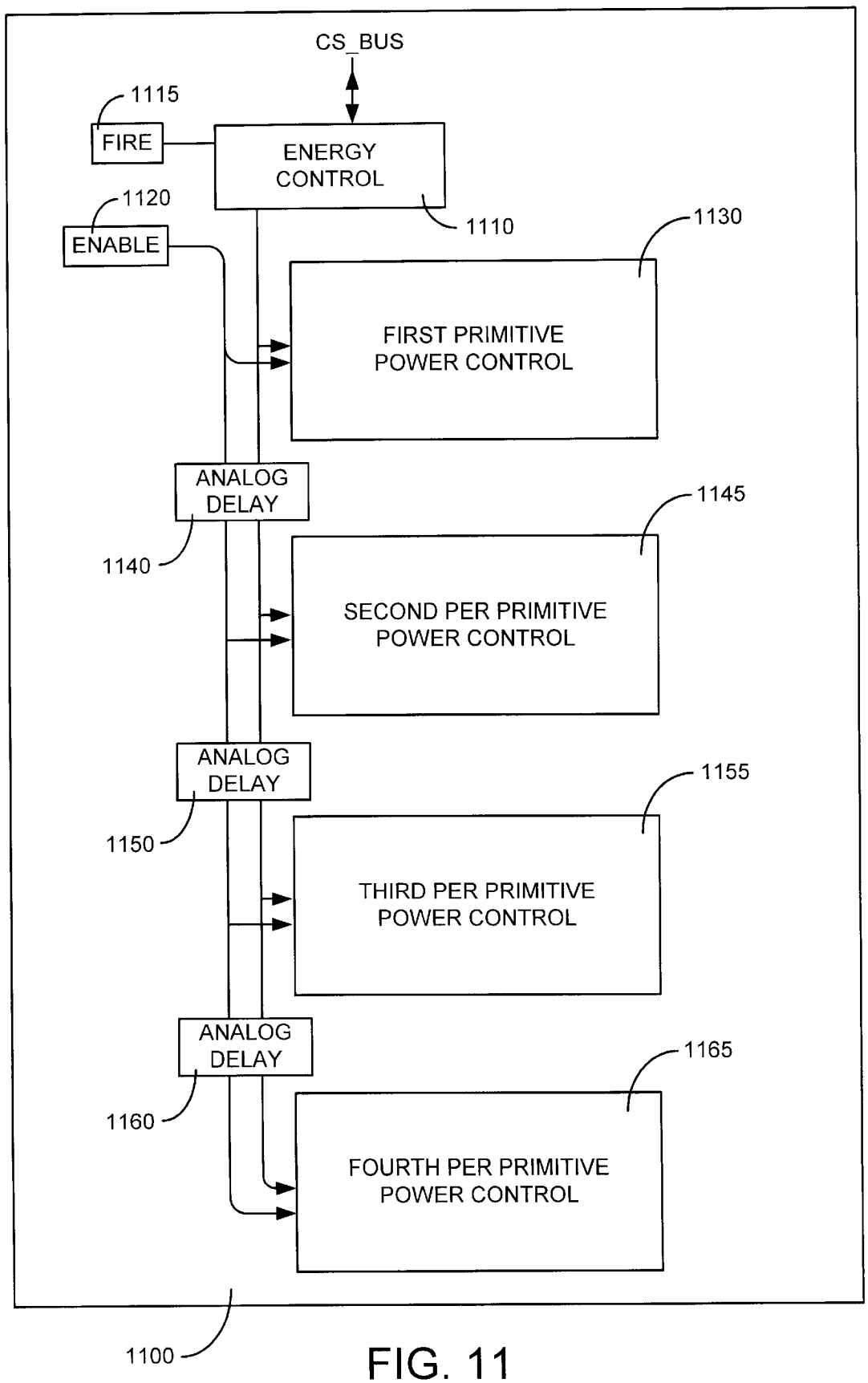
FIG. 11 illustrates an example of the fire pulse delay of the present invention.

FIG. 11 illustrates an example of the fire pulse delay of the present invention. In this example, the processing driver head is divided into plural sections. One such arrangement is having the sections divided in a manageable, yet efficient, manner, such as quadrant sections. Each quadrant can include nine primitives (grouping of resistors), eight analog delay devices (one for each primitive, except the first primitive) and one energy control block 1110. The energy control block 1110 is discussed in detail below. For convenience, FIG. 11 shows only four of the nine primitives within a quadrant 1100.

As shown in FIG. 11, the energy control block 1110 within the quadrant 1100 receives a fire signal 1115. The quadrant 1100 also receives an enable signal 1120. The fire signal 1115 and enable signal 1120 are sent in parallel to each primitive within the quadrant 1100. Initially, the fire signal 1115 and the enable signal 1120 are received undelayed by the first primitive power control 1130. As explained in detail below, each primitive power control uses an address control block and a data control block to control how each nozzle is fired over time. The first primitive power control 1130 is a short primitive (meaning that the primitive contains fewer nozzles than the other primitives). This first primitive power control 1130 receives the undelayed fire signal 1155 and the enable signal 1120 and passes them through the fire pulse delay 1140.

Both the fire signal 1115 and the enable signal 1120 are routed into fire pulse delays 1140 prior to sending them to the second per-primitive power control 1145. Similarly, the next fire pulse delay 1150 delays the fire signal 1115 and the enable signal 1120 before sending them to the third per-primitive power control 1155. Finally, the fire pulse delay 1160 delays the fire signal 1115 and the enable signal 1120 before they are sent to the fourth per-primitive power control 1165. This procedure continues until the fire signal 1115 and the enable signal 1120 have reached all of the primitives within the quadrant 1100.

The delay device can be any suitable mechanism for delaying the signal, such as a phase-locked loop, a precision reactive/capacitive (RC) time constant using for example, a pair of inverters, a reference threshold operational amplifier, a delay line and conventional methods for creating a delay.

Figure 12:
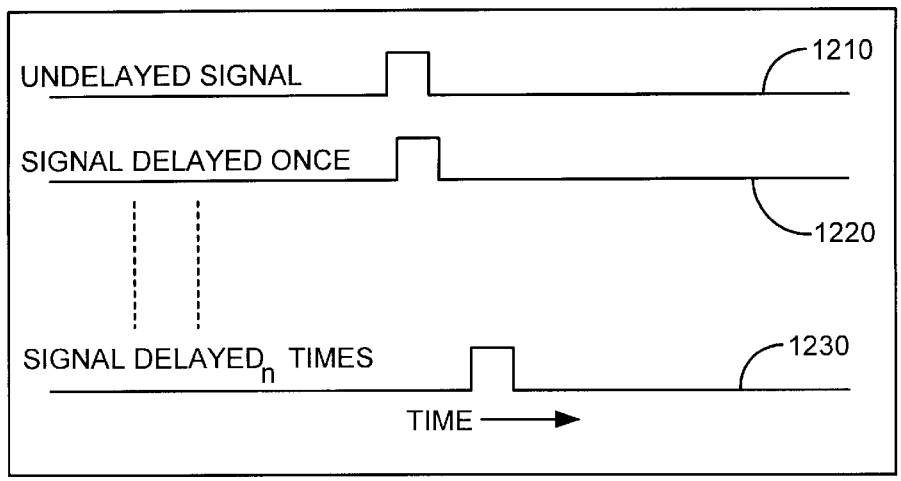
FIG. 12 illustrates the effect that a delay device has on an input signal.

FIG. 12 illustrates the effect that a delay device has on an input signal (e.g. the fire signal 1115 and the enable signal 1120). In this example, each input signal represents both the fire signal 1115 and the enable signal 1120 being sent to a respective primitive. Signal 1210 is an undelayed signal and is the first fire signal 1120 and enable signal 1120 to be received at a first primitive. Signal 1220 has been passed through a delay device and is received at another primitive slightly later in time from the signal 1210. Signal 1230 has been delayed n times and an nth primitive receives signal 1230 after the first and second primitives receive signals 1210 and 1220, respectively.

Figure 13:
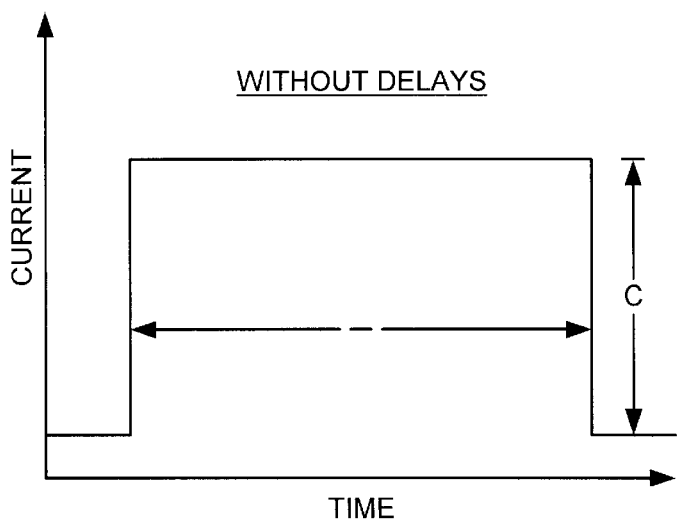
FIG. 13 is a plot of current versus time showing an undelayed fire signal.

FIG. 13 is a plot of current versus time showing a typical fire signal for a plurality of nozzles without any delays. The time t represents a short period of time and the current c represents the large amount of current required to simultaneously fire each nozzle receiving the fire signal. As can be seen from FIG. 13, the current rises and falls without delays.

Figure 14:
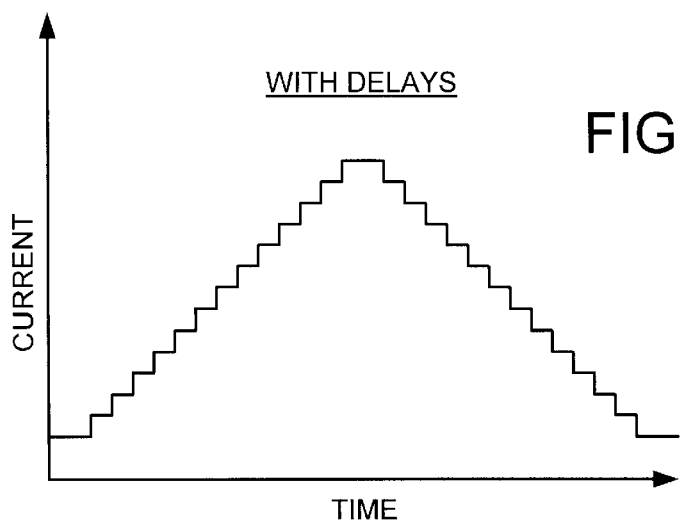
FIG. 14 is a plot of current versus time showing a delayed fire signal.

FIG. 14 is a plot of current versus time showing a fire signal with delays in accordance with the present invention. These delays are represented by the individual steps of the fire signal and indicate that fewer nozzles are beginning or terminating firing at any given time. FIG. 14 shows that the current rises and falls gradually with delays in contrast to the case without delays, as in FIG. 13. In addition, staggering the fire signals reduces the generation of unwanted EMI.

Intersectional Delay

As discussed above with regard to FIG. 11, the fire signal 1120 and enable signal 1120 (hereinafter referred to as a "fire pulse") are sent to all of the quadrants or sections on the processing driver head. One further way the present invention eliminates EMI effects is by delaying (either synchronously or asynchronously) the fire pulse (or portions of the fire pulse with either the fire signal, the enable signal or both) using an "intersectional delay" between each section of the processing driver head.

Figure 15:
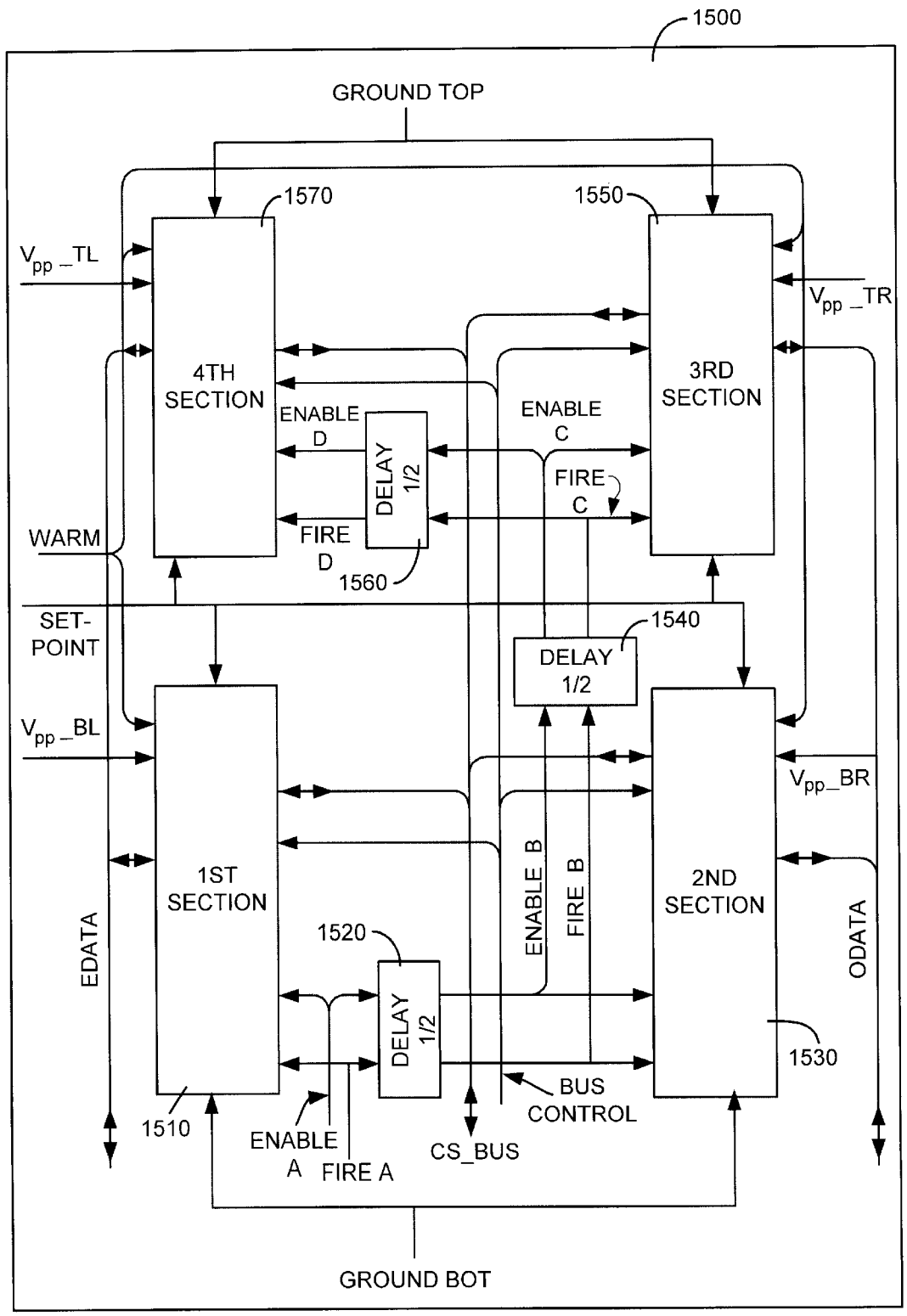
FIG. 15 illustrates an example of the intersectional delay of the present invention.

FIG. 15 illustrates an example of the intersectional delay of the present invention. In this example, the processing driver head 1500 is divided into four sections referred to as quadrants. Each section includes nine primitives (eight full-sized and one short primitive). Each section receives as input a fire pulse and delays the fire pulse for components thereof) between sections. This intersectional delay is in addition to the fire pulse delay between the primitives within each section.

The fire pulse is received by the section 1500 and sent to the first section 1510 in the lower left quadrant. This fire pulse to the first section 1510 is not delayed. The fire pulse travels to the first intersectional delay 1520 where the fire pulse is delayed before being sent to the second section 1530. The second section 1530 in the lower right quadrant send the fire pulse to the second intersectional delay 1540 and then to the third section 1550 located in the upper right quadrant. After travelling through the third intersectional delay 1560 the fire pulse is received by the fourth section 1570.

Preferably, each of the intersectional delays delay the fire pulse by some fraction of the master clock signal (MCLK). For example, a half cycle of MCLK (a half-clock cycle) can be used in each of the intersectional delays. In this case, the fire pulse would be delayed when passing between sections (except the first section) by one-half of a MCLK cycle. Although this example divided the processing driver head into four sections, those skilled in the art will recognize that a fewer or greater number of sections may be used.

There are additional possible firing delay sequences that can effectively reduce or eliminate problematic EMI emissions. As another example, consider a substrate similar to FIG. 4 except that it may have a different number of primitives and nozzles. The firing resistors may be arranged near the edge of the substrate as in FIG. 4 or located closer to the center of the substrate. In this example, the primitives are divided into groups of primitives numbered group0, group1, group2, etc. The fire pulse first reaches the group0 primitives without going through any delays. Before reaching the group1 primitives, the fire pulse goes through 1 delay element. It goes through 2 delays before reaching group 2, etc., and n delays before reaching group n. In a more particular example, primitives 1 and 2 are in group0, primitives 3 and 4 are in group1, etc. In this example, pairs of primitives are energized simultaneously.

Processing Driver Head Data

Before a print operation can be performed data must be sent to the processing driver head. This data includes, for example, nozzle data containing pixel information such as bitmap print data. Bi-directional communication occurs between the controller and processing driver head using the Command/Status (CS) data. The status data of the CS data includes, for example, processing driver head temperature, error notification and processing driver head status (such as the current print resolution). In the present invention CS data is transferred bi-directionally over multiple multi-bit (e.g. eight-bit) buses. Bus architecture was chosen to minimize EMI due to the fast switching of signals having large capacitive loads. Preferably, the processing driver head divides the nozzles into even nozzles on one side of the processing driver head and odd nozzles on the other. Both the even and the odd nozzles have their own bus (i.e. even data bus and odd data bus). In addition, CS data has its own bus. Providing a bus for the CS data permits the printhead assembly to provide CS data to the printing system during printing.

For each printing operation the printing system sends nozzle data to the processing driver head. This nozzle data is sent in serial format and may be divided into two or more sections (for example, even and odd nozzle data). Independent of nozzle data, command data may be written to and status data read from the processing driver head over the serial bi-directional CS data line. The CS data within the processing driver head are distributed to the appropriate registers over the multiple-bit CS data bus. Nozzle data is distributed within the processing driver head on a separate bus. In addition, more than one bus may be provided for this nozzle data, for example, an even nozzle data bus and an odd nozzle data bus.

Registers are used as an input buffer for nozzle data. Both the even and the odd nozzle data buses are connected to registers called the nozzle data loading registers. These registers are not erased until explicitly overwritten with new nozzle data. Consequently, during a typical print operation these registers will contain a mix of old nozzle data and new nozzle data. New data is stored in this processing driver head memory device while old data is being printed, so that printing operations are streamlined and printing speed increased. In order to save space on the processing driver head some registers can be duplicated on a per-primitive basis and accessed by connecting the CS data bus to the nozzle data bus. This arrangement also permits nozzle data to be read back over the CS data bus.

Figure 16:
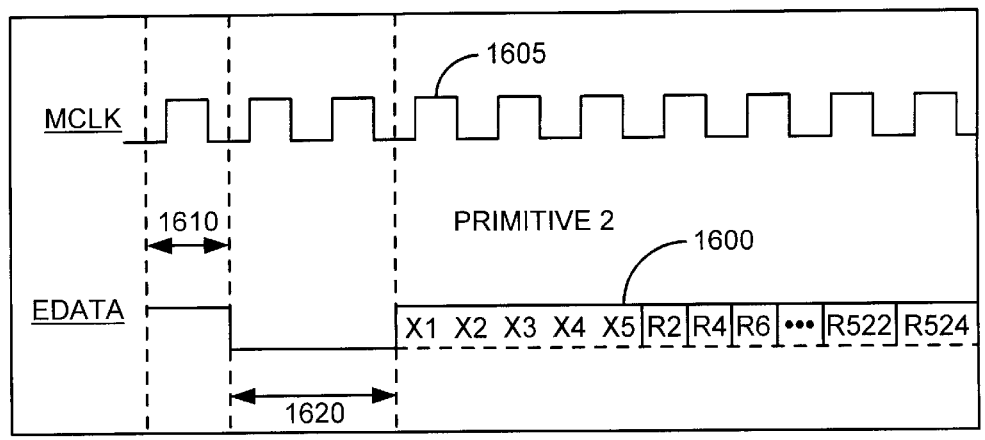
FIG. 16 is an example of how nozzle data is loaded into a register.

FIG. 16 is an example of how nozzle data is loaded into a register. In this example, there are 524 nozzles and half are even nozzles and the other half are odd nozzles. The input data shown in FIG. 16 is even nozzle data (EDATA 1600). The system master clock (MCLK 1605) provides a time reference. At period 1610, data transfer has not yet begun and the EDATA 1600 signal is at level "1" (the high position). At the beginning of period 1620 the nozzle data transfer is initiated by sending a series of "0" (the low position) for four consecutive half-cycles of MCLK 1605. The nozzle data that follows contains firing patterns for nozzle 2 through 524 in sequence. A "1" will cause the nozzle to fire while a "0" will suppress the nozzle firing.

The initial nozzle data of EDATA 1600 after period 1620 corresponds to primitive two, which is a short primitive and contains only three nozzles. In the exemplary embodiment, the first five bits of the nozzle data of EDATA are thrown away (as represented by $X_1$ through $X_5$). The three bits that follow are sent to the corresponding nozzles (represented by $R_2$ through $R_6$). The next primitive is full (represented by $R_8$ through $R_{38}$). The odd nozzle data and the command/status data is loaded in a similar manner.

Fractional Dot Delay

The present invention also uses another type of delay in order to compensate for scan axis directionality (SAD) errors. SAD is the measure (in degrees) of the ink drop ejection angle with respect to the normal of the processing driver head, which is an error in the drop trajectory in the scan axis direction. The scan axis is the axis along which the printhead assembly and carriage move during various operations such as a printing operation. In general, a SAD error occurs when an ejected ink drop does not land on the print media (such as a piece of paper) exactly where desired along the scan axis.

Normally, at least one fire pulse is sent to a nozzle for each dot (e.g. a single ink drop) printed. As such, a set of dots is created by a set of fire pulses. A set, which can be a primitive of nozzles, for instance, can have sixteen fire pulses per set of 16 dots printed. This means that the processing driver head will move one dot diameter during those 16 fire pulses, one-half of a dot diameter during 8 fire pulses and so forth. Offsetting the spot where the dots contact the print media is accomplished by providing a delay corresponding to the appropriate number of fire pulses before sending the entire set of fire pulses (in this case, sixteen) to the nozzle set. By adjusting the (use either delay or wait time), the present invention compensates for SAD errors on average for a set of 16 nozzles.

In general every nozzle set has a different SAD error that is usually determined at the time of manufacture. This SAD data is stored in the printing system memory device and is used by the distributive processor in compensating for SAD errors. Namely, the distributive processor uses the stored data for individually programming each nozzle for delaying its firing by various fire pulses. Consequently, for example (assuming sixteen fire pulses per dot), one dot set may be shifted by 4 fire pulses (quarter dot delay) while another set may be shifted by 8 fire pulses (half dot delay). Using this fractional dot delay the present invention can compensate for SAD errors in each and every nozzle set. In the event that the printing system memory device is of limited capacity, it may be desirable to compensate for trajectory errors for groups of nozzles. If memory capacity is not an issue, each group can comprise of one nozzle.

III. DIGITAL FUNCTIONALITY

Data is stored (in digital form) in a digital storage device, which is partitioned into smaller sections called registers. Each register has its own unique address and printing system components can write to or read from a register by using a specific protocol. This protocol provides a method of internal communication between a register and system components. For instance, bi-directional access to the register allows some printing system components (such as the printhead assembly) to perform operations (such as a firing pulse delay) by accessing certain data (such as pulse width) within the registers. If the data is in analog format (such as sensed temperature) it is preferably converted into digital format prior to storage in a register. Manipulating data using this digital format provides noise immunity.

Communications between the registers and the printing system components is performed using multiple multi-bit busses. Bus architecture aids in reducing undesirable effects (such as EMI) precipitated by the switching of large amounts of power in a short time period. Further, multiple busses means that data (such as nozzle data) can be divided into smaller sections (for example, even data (Edata) and odd data (Odata)). The bus architecture also provides dynamic and constant bi-directional communication between, for example, the controller and the processing driver head. This permits actions and decisions to be made quickly and simultaneous with actual ink printing.

In addition, the data transmitted between the controller and the printhead assembly is preferably transmitted serially. Serial data transmission allows the addition of nozzles without the inherent need to increase leads and interconnections. This reduces the expense and the complexity of providing internal communications for the printhead assembly.

Internal Functions Overview

The digital operations within the printhead assembly are an interaction of a plurality of components and systems. These processes within the printhead assembly work with one another to receive and distribute data. Data is bi-directionally transmitted using the communications procedures described above.

Figure 17:
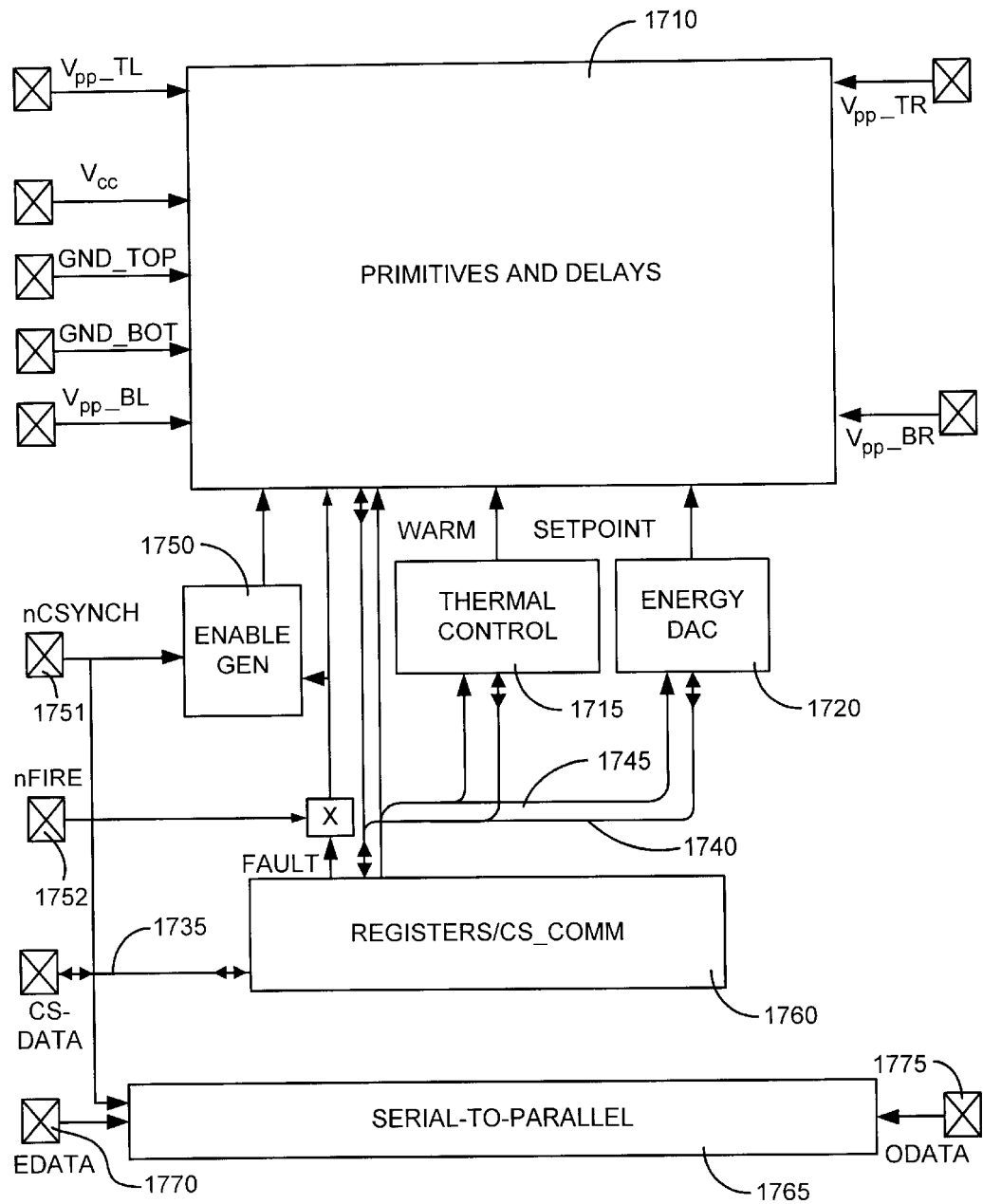
FIG. 17 illustrates an overview functional block diagram of the operation of the printhead assembly.

FIG. 17 illustrates the major systems and components of the printhead assembly and how each interacts with one other. The nozzle resistors can be classified within groups. Each group of nozzle resistors is hereinafter referred to as a primitive. Each primitive can contain the resistors for vaporizing ink drops and each resistor in the primitive can be connected to a power supply on one side and to a power ground on the other side for the power current on the other side. In this case, power for firing the resistors travels from the power supply to the resistor power connections, heats the resistor and is routed to ground. Preferably, no more than one resistor in a primitive will fire at any given time.

As a working example, a printhead assembly can have 36 primitives in two columns of 18 primitives each. The center 16 primitives each have 16 nozzle resistors while the two end primitives each have only three nozzle resistors (referred to as "short" primitives). The nozzle resistors on one side of the printhead assembly all have even numbers while the nozzle resistors on the other side all have odd numbers, as shown in exemplary embodiment of FIG. 4.

As shown in FIG. 17, the primitives and delays 1710 interact with the thermal control 1715 and an Energy DAC (digital-to-analog converter) 1720. The thermal control 1715 includes a thermal sensor and a thermal control device. The thermal control 1715, which can furnish control via the CS data bus 1740 or locally, keeps the printhead assembly above a desired temperature and also shuts down the printhead assembly if the temperature exceeds a maximum temperature. An input to the primitives arid delays 1710 is the energy DAC 1720 that provides the analog setpoint for the energy control blocks, which are discussed further below. The energy DAC 1720, which sends and receives data through the CS data bus 1740, also controls the fire pulse width.

The enable generator 1750 receives a start signal (nCSYNCH) 1751 for initiating a firing sequence and generates at least one enable signal which together with a fire signal (nFIRE) 1752 make up a set of fire pulses. As an example, the enable generator 1750 produces four enable signals each sixteen pulses wide.

The registers/CS communication 1760 described below handles communications over the data lines (e.g. the CSDATA line 1735). The serial-to-parallel 1765 transforms incoming serial data into parallel data. In this example, the even nozzle data (EDATA) 1770 and the odd nozzle data (ODATA) 1775 are inputs to the Serial-to-Parallel 1765 and the EDATA 1770 and ODATA 1775 are converted from serial input to paral el output. The advantage of serial input is that fewer lines and interconnects are required. In addition, it should be noted that the nozzle data 1770, 1775 and the CSDATA 1735 can be transmitted simultaneously and in parallel.

With regard to the primitives and delays 1710, certain resistor firing delays can be associated with the primitives. In general, the primitives and the delays 1710 control the nozzles of the printhead assembly. Every primitive within the primitives and delays 1710 has a per-primitive address control (not shown) for generating addresses and a per-primitive data control (not shown). These two systems together control the nozzle firing. Specifically, the per-primitive address control handles the fractional-dot delays, the per-primitive registers, as described above, and the address counter. The address counter steps through the 16 addresses and indexes which address is firing in that primitive because the addresses are preferably fired one at a time. The per-primitive data control handles nozzle data, the decoding of the address counter and the actual firing of nozzles.

Figure 18:
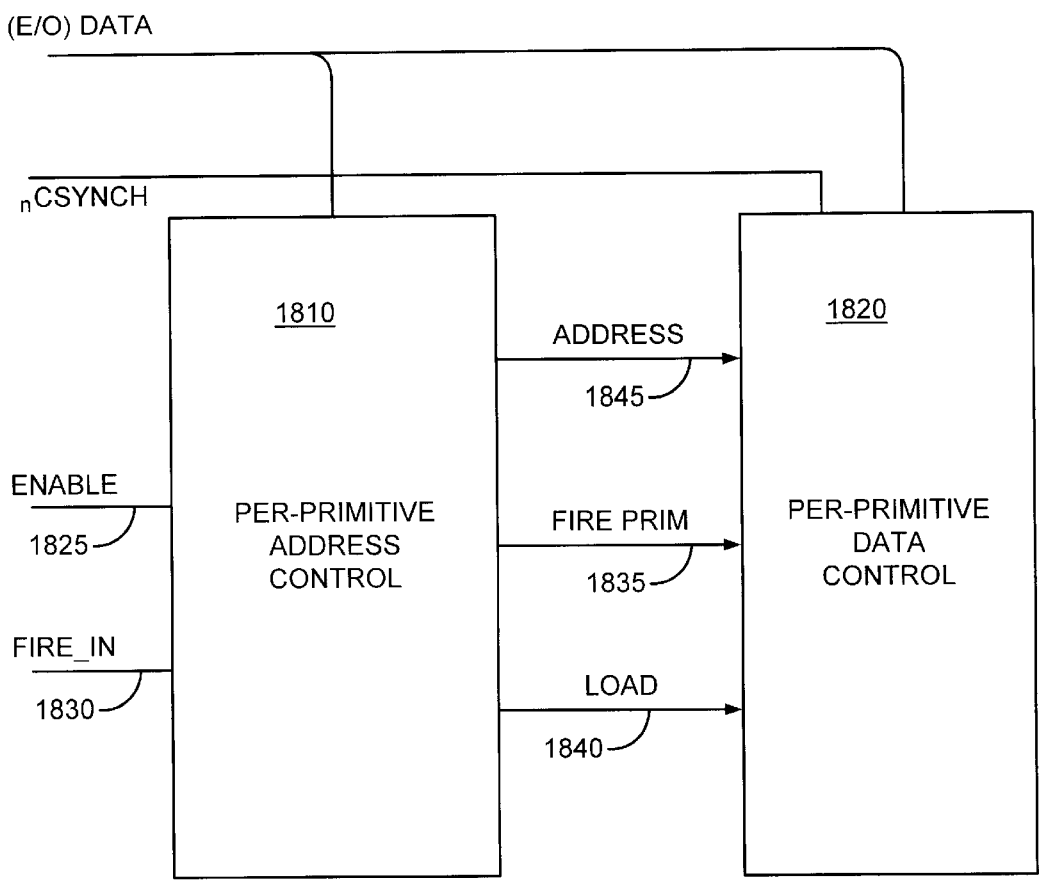
FIG. 18 illustrates an example of a single per-primitive power control.

FIG. 18 illustrates an example of a single per-primitive power control of the type that was discussed briefly above in connection with FIG. 11. Referring back to FIG. 17 along with FIG. 18, every primitive on the printhead assembly preferably contains the per-primitive address control 1810 and the per-primitive data control 1820. The address control 1810 receives EDATA and ODATA 1770, 1775 of FIG. 17, a fire pulse 1825 and an enable signal 1830, such as the fractional dot delay pulse, to produce a fire primitive signal 1835, a load signal 1835 and an address signal 1845. The address control 1810 generates an appropriate addressing pattern for the firing variables. The per-primitive data control 1820 receives the fire primitive signal 1835, the load signal 1840, the address signal 1845, and the nCSYNCH, EDATA and ODATA signals 1751, 1770, 1775 of FIG. 17 for controlling nozzle firing.

Figure 19:
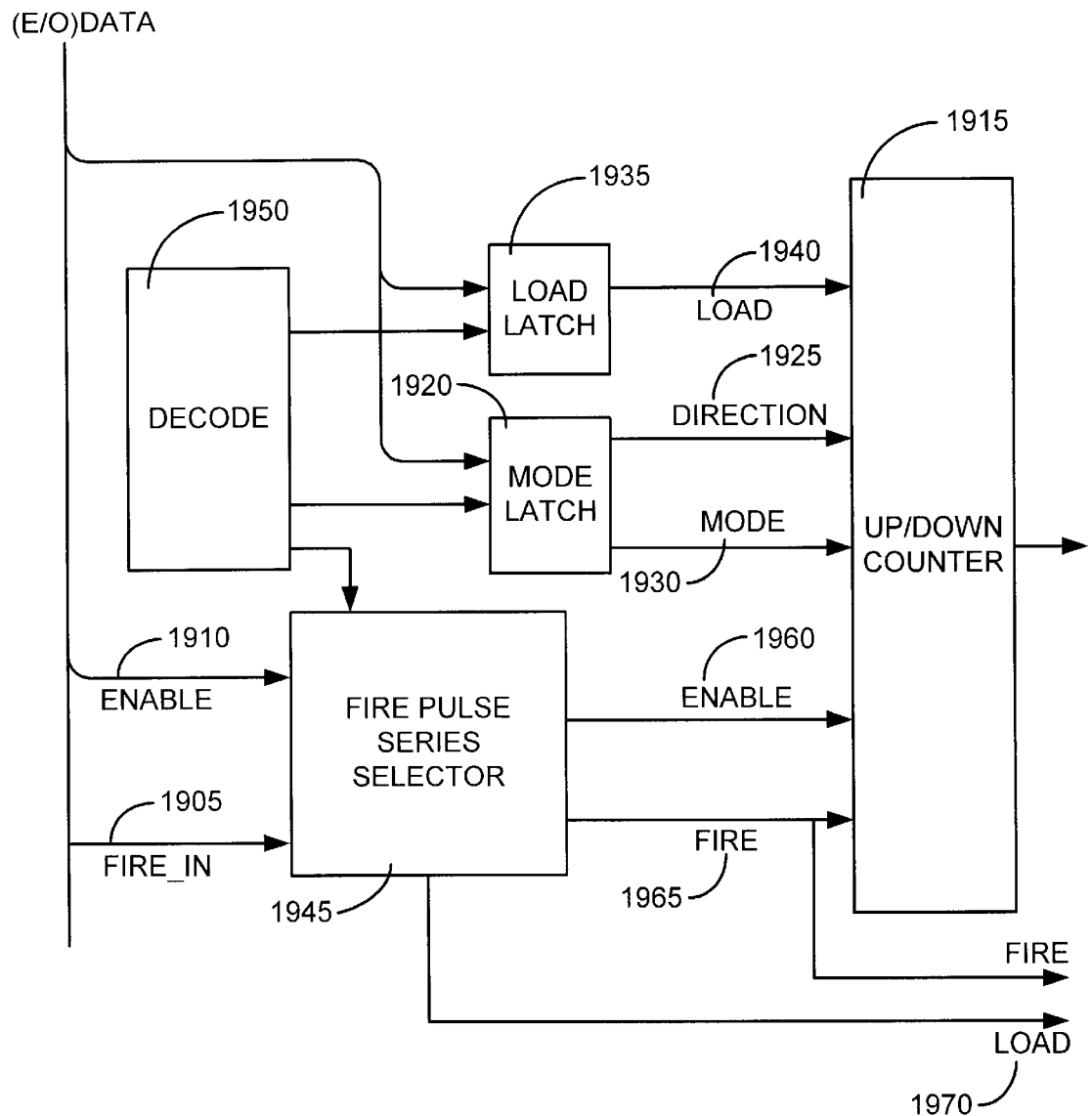
FIG. 19 is a detailed illustration of the per-primitive address control of FIG. 18.

FIG. 19 is a detailed illustration of the per-primitive address control of FIG. 18. As discussed above, the per-primitive address control 1900 is generally an address generator that uses a fire pulse 1905 and the fractional dot delay pulse 1910 to generate an appropriate addressing pattern for the firing variables. The address control 1900 includes an up/down counter 1915, a mode latch 1920, a load latch 1935 and a fire pulse series selector 1945.

The mode latch 1920 receives nozzle data, such as the EDATA and ODATA 1770, 1775 of FIG. 17 and determines the correct counter operating mode for the up/down counter 1915 to operate. In general, this counter operating mode is determined by the direction variable 1925 and the print mode variable 1930. In this example, these two variables are shared by all primitives on the printhead assembly. The load latch 1935 receives the data (for example, nozzle data EDATA and ODATA 1770, 1775 of FIG. 17) from the appropriate source (such as the printing system) and loads the data into the up/down counter 1915 via the load signal 1940.

The fire pulse series selector 1945 receives and processes the fire pulses 1905 and fractional dot delay pulses 1910 by delaying and selecting an appropriate signal to produce an enable signal 1960, a fire signal 1965 and a load signal 1970. This can be accomplished with, for example, a delay latch and a signal selector. The enable signal 1960 and fire signal 1965 are sent to the up/down converter 1915. The fire signal 1965 is also sent to a nozzle drive logic device (to be discussed in detail below) and the load signal is sent to a current print data register (to be discussed in detail below).

The up/down counter 1915 is a multi-bit up/down counter that receives the direction and mode signals 1925,1930 from the mode latch 1920, the load signal 1940 from the load latch 1935, and the enable and fire signals 1960, 1965 from the fire pulse series selector 1945. The up/down counter 1915 is clocked by a clocking signal can be used to ensure that only the desired number of fire pulses (for instance, 16 fire pulses) are sent to each primitive following a firing command. Different address sequences are required depending on the print mode. In this example the 600 dpi mode has a 4-bit up/down sequence. However, the 1200 dpi mode is more complicated and uses address shifting.

Further, a decode device can be included in the per-primitive address control for decoding an address and allowing each primitive to access registers of the mode latch 1920, the load latch 1935 and the fire pulse series selector 1945.

Figure 20:
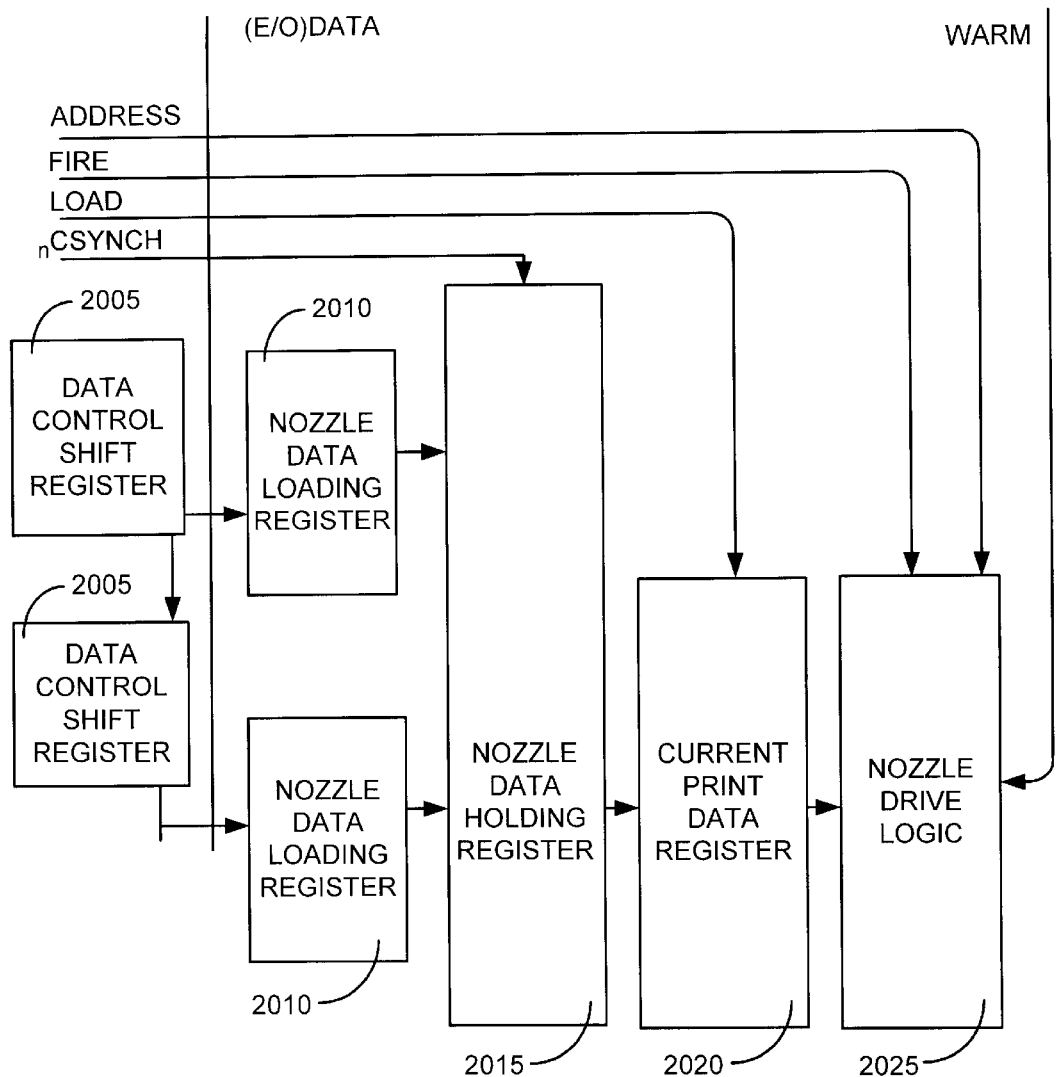
FIG. 20 is a detailed illustration of the per-primitive data control of FIG. 18.

FIG. 20 is a detailed illustration of the per-primitive data control of FIG. 18. In general, the per-primitive data control takes the address information supplied by, the per-primitive address control and combines the information with nozzle data. In this way the per-primitive data control helps determine which nozzle it should fire.

The data control shift register 2005 is divided into a plurality of registers and prepares incoming data for use by the per-primitive data control 1820. The nozzle data loading register 2010 is also divided into a plurality of registers and receives print data from the printing system. In general, these registers are the input buffers for print data. During a typical print operation these registers will contain a mixture of old and new print data while the new print data is being loaded. These registers are static and will retain the contents until they are explicitly overwritten by new print data. Moreover, these registers are not cleared by a printhead assembly reset.

The nozzle data holding register 2015 is a holding register for the contents of the nozzle data loading register 2010. The current print data register 2020 buffers the print data through a delay data latch (not shown) before reaching the nozzle to be fired. The delay data latch is controlled by the same signal that controls the fractional dot delay. The nozzle drive logic 2025 contains a plurality of electronics to provide the means to fire the nozzles.

Register/Command-Status Communications Functional Overview

Figure 21:
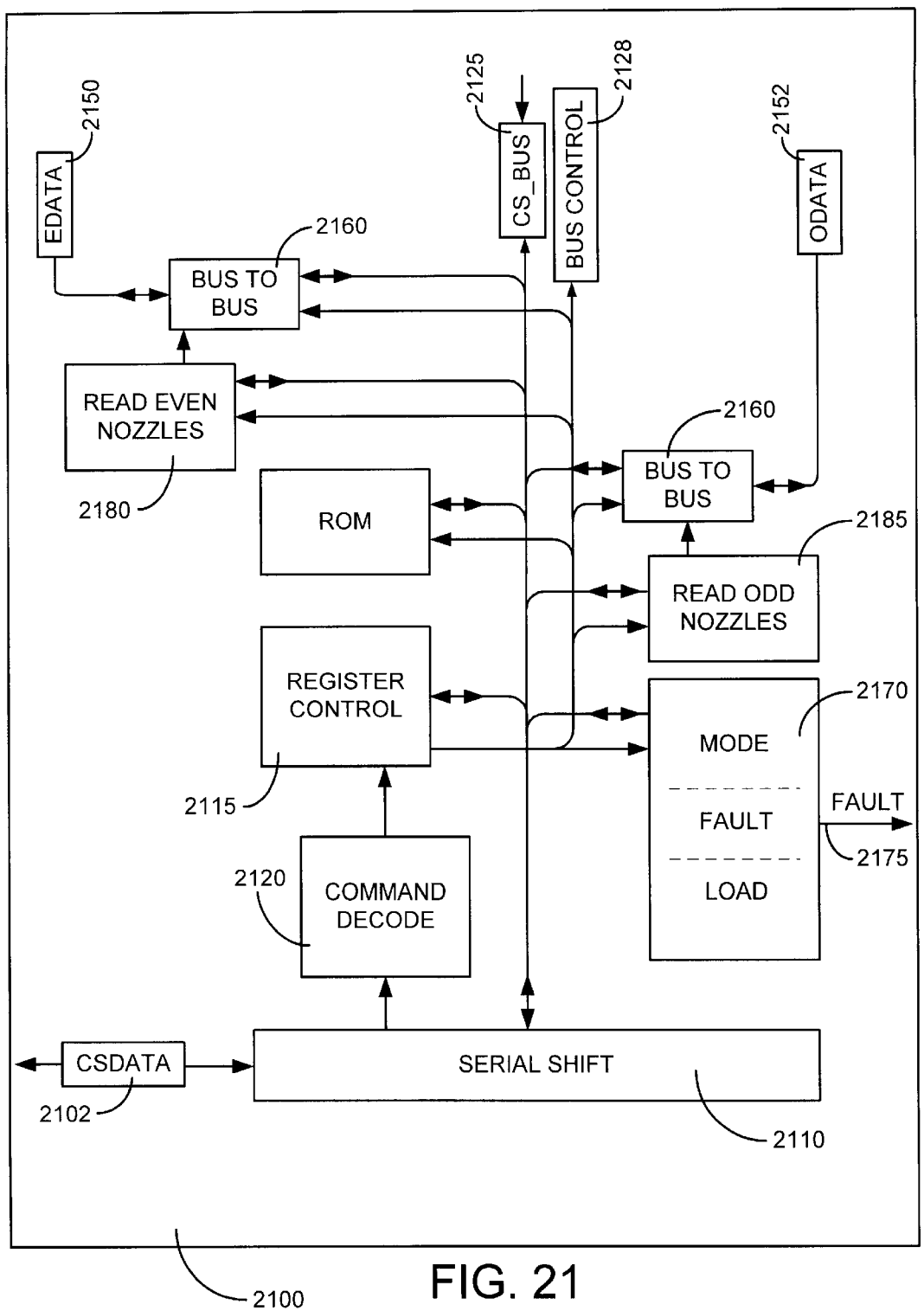
FIG. 21 is a functional block diagram of an example of a communications block for controlling the printhead assembly internal communications.

FIG. 21 is a functional block diagram of an example of a Registers/Command/Status Communications device of FIG. 17. The Registers/Command/Status Communications device 2100 (an example of element 1760 of FIG. 17) can be used for controlling the printhead assembly internal communications. Referring to FIG. 17 along with FIG. 21, data is received as input and various control signals are generated and received. This internal communications is achieved using a command status data bus and protocol over the Command/Status (CSDATA) data line 2102.

The serial shift 2110 is both a serial-to-parallel converter and a parallel-to-serial converter. When the serial shift 2110 receives serial information over the CSDATA line 2102 the serial shift 2110 checks for start bits and then latches the address and data words. Even if the command is a register read, dummy data is sent and ignored in the interest of simplifying this interface. The address and data are sent to the register control 2115 through the command decode 2120. When the serial shift 2110 transmits data over the CSDATA line 2102 the serial shift 2110 latches a parallel word from the CS Bus 2125 and sends it back out over the CSDATA line 2102 in serial format.

The command decode 2120 checks the address word of each command to determine whether the command is valid and whether the command is a read or write. This information is then passed to the register control 2115 and the serial shift 2110. The register control 2115 handles the actual mechanics of reading from and writing to the various registers. The register control 2115 also drives the bus control 2128 that contains the signal indicating when to latch an address or data word and whether a command is a read or a write.

Some of the registers have copies that can be written via the nozzle data bus. This nozzle data may include an even nozzle data (EDATA) bus 2150 and an odd nozzle data (ODATA) bus 2152. The master register, which is typically accessed over the CS bus 2125, must be connected to the EDATA bus 2150 and the ODATA bus 2152. The bus-to-bus 2160 performs this connection and has write signals coming from the bus control 2128 and read signals coming from the read nozzle registers. These read nozzle registers may include even nozzle registers and odd nozzle registers.

The mode/fault/load 2170 contains the mode, fault and load master registers. Each of these registers have local versions at each primitive. The fault register records the temperature faults and generates a fault signal 2175 that disables nozzle firing. The nozzle register (not shown) contains data that enables the read back of nozzle data. As shown in FIG. 21 the nozzle register may be divided into a read even nozzles register 2180 and a read odd nozzles register 2185 whereby the read back of even nozzle data occurs in the read even nozzles register 2180 and the read back of odd nozzle data occurs in the read odd nozzle register 2185. The details on each of these registers and how read back is performed are discussed below.

Systems Operations

Most operations in the printhead assembly receive their instructions from their corresponding register contents. These instructions can be written to and read from the registers. In addition, some registers have a read-back capability that permits any information written to the register to be verified. In order to save physical space on the printhead assembly most of the registers are left undefined until information is explicitly written to them. Nearly all register read and write operations are conducted using the Command/Status data bus and protocol.

The CS data bus and protocol permits the printing system to access the registers on the printhead assembly via a communications interface. This interface is a bi-directional serial interface that permits writing to and reading from the register. The printing system notifies the register that the printing system wants to access the register by sending a bit stream to the register as a series of zeros to indicate that data is to follow. The bit following the leading zeros indicates whether the register is to be read or written. Following this read/write bit are the remainder of the command bits that instruct the register how to process the enclosed data followed by the actual data bits.

A register write operation includes a command and data transfer to the printhead assembly followed by a status response capture by the printing system. Similarly, a register read operation includes a command and data transfer to the printhead assembly followed by a status response and a read back capture by the printing system. All data command and status transfers transfer data with the most significant bit (MSB) first and read back data appears MSB first. The status response is sent by the printhead assembly to the printing system and verifies the current state of the read or write operation.

Figure 22A:
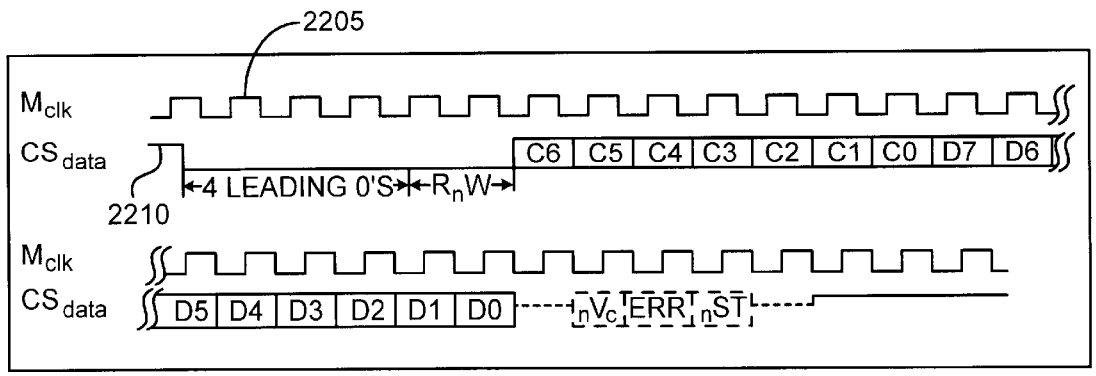
FIG. 22A illustrates a working example of a register write operation.

FIG. 22A illustrates a working example of a register write operation. The master clock signal (MCLK) 2205 is driven by the printing system. Below the MCLK 2205 is the command and status data signal (CSDATA) 2210 that is also driven by the printing system. In order to initiate access to the register the printing system holds the CSDATA signal 2210 low (i.e. each bit is a "0") during four clock cycles of MCLK 2205, meaning that four consecutive zeros are sent to the printhead assembly by the printer. This indicates to the register that the printing system desires access to the register. Immediately following the leading zeros are eight command bits indicated by bits C7 through C0. The first command bit C7 is the MSB and specifies whether the operation is a read operation ("1") or a write operation ("0"). Following the eight command tits are eight data bits that contain the data to be written to the register. After the data has been written to the register the printhead assembly returns a status response consisting in this example of three bits. These status response bits are described below in a working example of a status response.

Figure 22B:
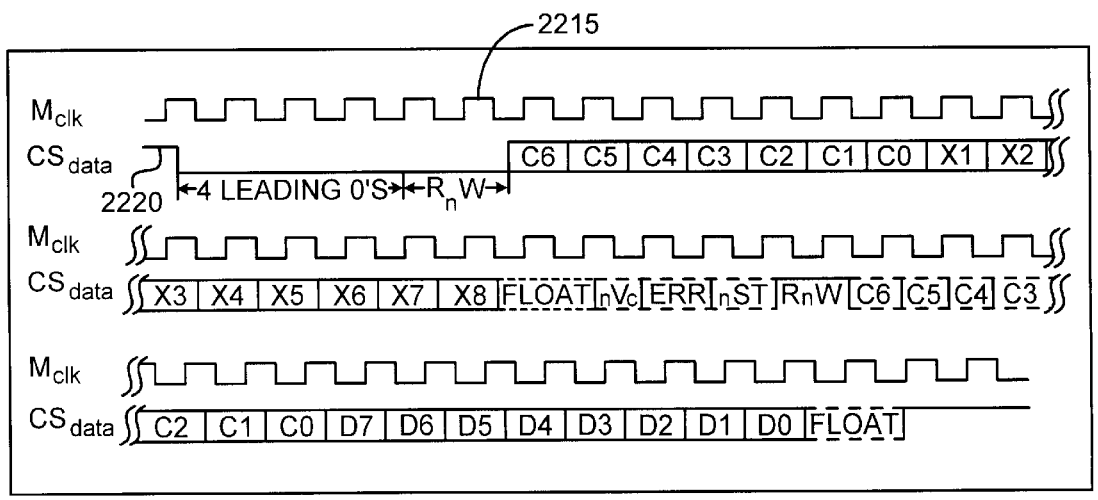
FIG. 22B illustrates a working example of a register read operation.

FIG. 22B illustrates a working example of a register read operation. The CSDATA signal 2220 is held low for four MCLK 2215 clock cycles by the printing system to allow access to the register. The first (MSB) command bit follows and indicates whether the operation is a read or a write. In this example, the first command bit is a "1" to indicate that this is a read operation. The remainder of the command bits C6 through C0 are sent by the printing system followed by eight data bits. These data bits are "dummy" data bits and are only to simplify the interface protocol and are not used by the register. After the printing system sends these eight dummy data bits the printhead assembly returns to the printing system a status response consisting in this example of three bits. Following this status response the eight command bits sent by the printing system are echoed back to the printing system and eight data bits containing the register contents are sent to the printing system by the printhead assembly.

As shown in FIGS. 22A and 22B a read or a write operation is followed by a status response capture by the printing system. The status response is sent by the printhead assembly to the printing system and verifies the current state of the read or write operation. In the working examples of FIGS. 22A and 22B the status response contained three status bits: (a) a bit indicating the validity of the last command; (b) a state of the error flag; and (c) whether the last command was interpreted as a status read operation. The first status bit, a "not valid command" bit, is "0" if the command is recognized as valid and a "1" if the command is invalid. If the command is not recognized as valid the printhead assembly will not act on the command. In the case of an invalid write command the data sent to the printhead assembly will be ignored. In the case of an invalid read command no further data after the 3 status bit will be returned by the printhead assembly to the printing system.

The second status bit is the error bit and can be either a "0" indicating the printhead assembly is operating normally or a "1" indicating that the an error condition has occurred. The error bit is set to "1" if a fatal error condition has occurred or the printhead assembly. This fatal error condition includes the case where the Fault temperature has been exceeded indicating that nozzle firing operations should be terminated. This is only one example of a fatal error condition and several others will be apparent to those of ordinary skill in the art.

The third status bit is the "not status request" bit. This bit indicates whether the printhead assembly has detected a status request command (a register read) from the printing system. If a status request command has been requested the bit will be set to "0" and the printhead assembly will return status information to the printing system immediately following the third status bit. In the working example of FIGS. 22A and 22B this status information contains sixteen bits. If this third status bit is set to "0" then the printhead assembly has detected a write command. The purpose of this third status bit is to provide warning in case any noise should cause the printhead assembly to interpret a register write command as a register read command. If this bit is returned as a "0" at the end of a register write command the printing system is alerted to not begin driving the CSDATA line for sixteen more MCLK cycles

Printhead Assembly Resetting

The registers of the printhead assembly can be put into an operational condition during the power-on sequence by a process known as resetting. Resetting establishes provides known data to certain registers that preferably should not have random register contents. These registers must be set to known value prior to any printing operations. Registers not affected by resetting include those registers containing error data.

Driver Head Control

The present invention improves processing driver head performance and reliability by controlling the energy delivered to the driver head and the temperature of the driver head. Referring back to FIG. 1A and 1B, the distributive or data processor 124 can incorporate energy control devices 132 and thermal control devices 136 within its own circuitry, as shown in FIG. 1B. Alternatively, the controller can incorporate these devices. The energy control device 132 can be used to compensate for variations in primitive supply voltage (VPP) that arise due to parasitic interconnect resistance between the printer carriage and the interconnect pad of the printhead assembly 116. This can be accomplished by, for example, adjusting the fire pulse width to ensure constant energy delivery.

The thermal control device 136 can be used for maintaining the driver head 126 at a programmable minimum temperature and for providing digital feedback to the printer and indicating current driver head temperature and temperature regulation status. Both energy and thermal control devices 132, 136 can be disabled through associated control registers (discussed above) of the distributive processor 124. Preferably, analog to digital converters (ADCs) and digital to analog converters (DACs) are used (not shown in FIGS. 1A and 1B). An analog temperature sensor 140 measures the temperature of the driver head 126 and the ADC converts the measurement to a digital word. The DAC receives the digitally converted signal and makes appropriate energy and temperature setting adjustments. Dedicated analog +12 V and ground pads can be used to minimize the impact of digital noise on performance.

IV. ENERGY CONTROL

Figure 23:
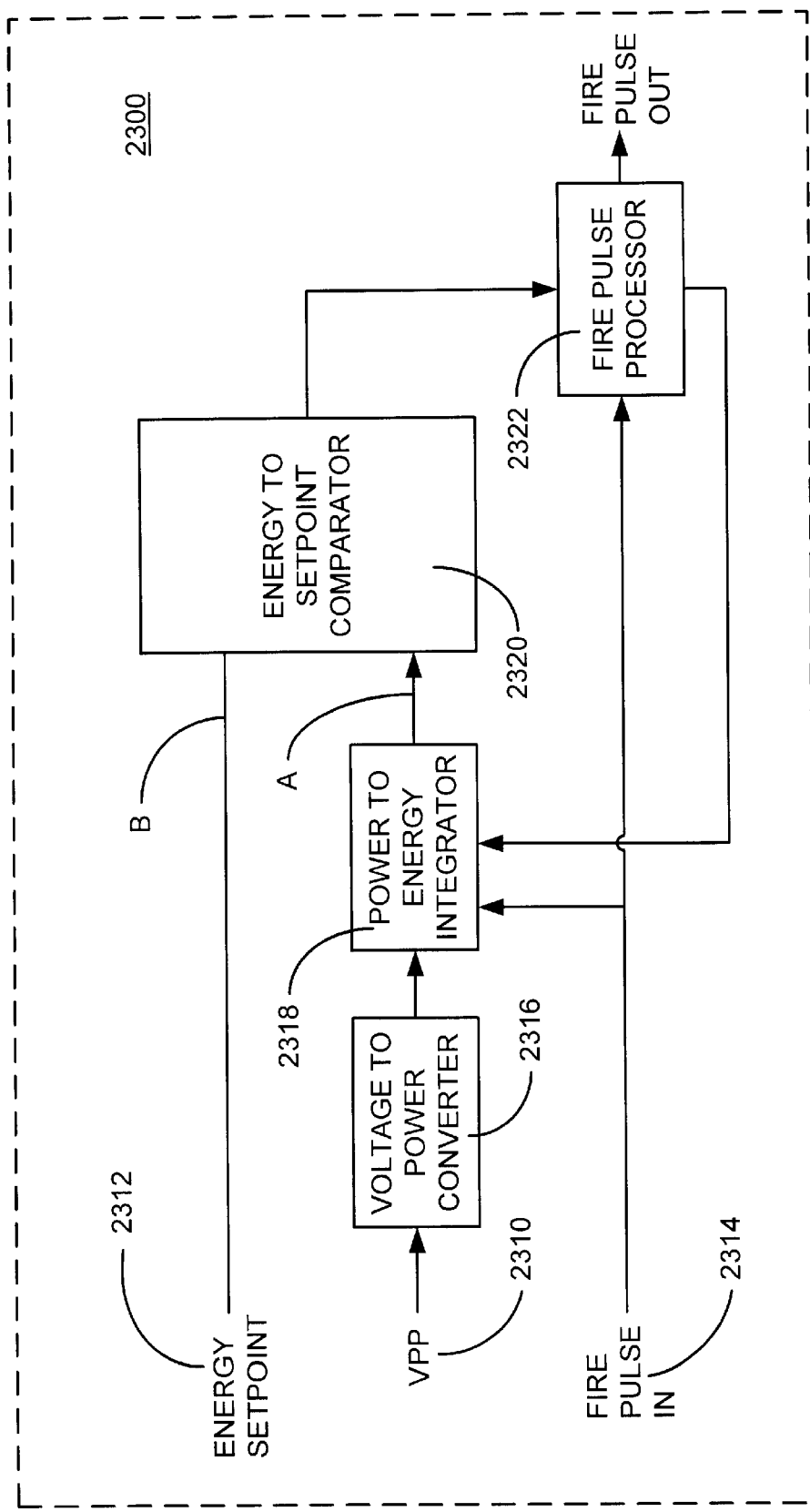
FIG. 23 illustrates a schematic of an exemplary energy control device.

FIG. 23 illustrates a schematic of an exemplary energy control device. The energy control device 2300 includes a supply voltage input 2310, an energy setpoint input 2312, a fire pulse input 2314, a voltage to power converter 2316, a power to energy integrator 2318, an energy to setpoint comparator 2320 and a fire pulse processor 2322. The supply voltage input 2310, such as VPP, is applied to the printhead assembly, the fire pulse input 2314 activates the integrator 2318 and the energy setpoint input is applied to the comparator 2320. The comparator 2320 compares the energy at point A and point B.

If energy at point A exceeds the setpoint energy at point B, and the normal fire pulse width has not been exceeded, the comparator 2320 issues a truncation command and the processor 2322 truncates the fire pulse. The processor 2322 then issues a reset signal that resets the integrator 2318. If, however, the energy at point A does not exceed the setpoint before the normal fire pulse width is exceeded, no truncation signal is issued. After the normal pulse width is achieved, the processor 2322 issues a reset signal to the integrator 2318. As a result, the energy control device 2300 regulates delivered energy to the heater resistors of the printhead assembly.

The energy control device regulates delivered energy to the heater resistors by compensating for variations in printhead assembly supply voltage (VPP) at each VPP pad. Typically, the primary source of error in delivered energy will come from load current variations interacting with parasitic resistance, including interconnect resistance. The energy control device of the present invention can be configured to regulate the delivered energy over a wide variety of operating conditions simply by programming an energy set point register of the distributive processor. This register establishes the output voltage of the energy DAC, which in turn determines the amount of energy delivered to the resistors.

Calibration

The energy control device is preferably associated with calibration techniques so that the optimum regulation point of the control circuitry can be determined and intra-substrate offsets can be nulled out. Since semiconductor wafer process variations usually introduce gain and offset errors into the control loop, the energy control device is preferably calibrated prior to use. This allows the optimum regulation point for each control circuit to be set and inter-quadrant offsets to be nulled out. Thus, the present invention provides energy set point calibration and quadrant slope calibration.

Calibration During Manufacturing

Prior to delivery and use, the printhead assembly preferably undergoes a one-time factory calibration process to compensate for variations within the sections of the printhead assembly. These variations include variations between resistors and internal trace and parasitic resistances. The resistances in the printing system and in the power connections between the printhead assembly and the printing system tend to differ between printing systems and with different installations of the same printhead assembly in the same printing system. Hence, variations internal to a given printhead assembly are preferably identified and compensated for during the manufacturing process. Proper calibration ensures proper energy to the resistors and extends resistor life.

Manufacturing calibration serves to identify the operational differences between the four functional quadrants of the printhead die, in particular the different resistances in the traces and connections for each different quadrant. Also, the resistor dimensions may vary within tolerances, and these variations may tend to be consistent with n each quadrant, and different between quadrants. In addition, the semiconductor manufacturing process may generate variations that are minimal within each quadrant, but which create variations within each substrate, from quadrant to quadrant.

Figure 24:
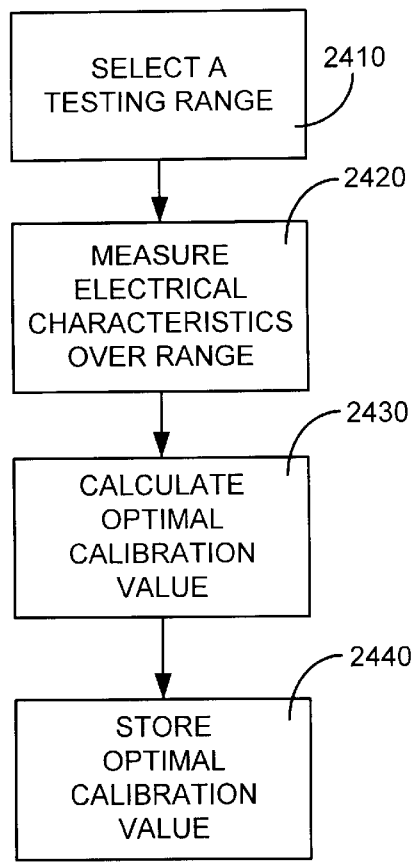
FIG. 24 illustrates a general flow diagram of a manufacturing calibration technique in accordance with the present invention.

FIG. 24 illustrates a general flow diagram of a manufacturing calibration technique in accordance with the present invention. In general, as shown in FIG. 24, first, a testing range is selected for the printhead assembly (box 2410). Electrical characteristics of the electrical components are then measured over the testing range (box 2420). Next, an optimal calibration value for the electrical characteristics of each section is calculated (box 2430). Last, the optimal calibration values are stored in the memory device of the printer or the printhead assembly (box 2440).

Specifically, the factory calibration can first determine the turn on voltage (TOV) and then calculate an operating voltage (VOP) that provides sufficient over energy. This voltage is written as VOP to the memory device of the printhead assembly. Quadrant truncation can then be adjusted as it occurs when VPP exceeds VOP. With the memory device thus programmed, the printhead assembly may be delivered to a user, either in conjunction with a printer, or as a replacement printhead assembly. In addition, the controller or printhead assembly can perform a power supply voltage and parasitic resistance test to determine the correct voltage to use and ensure that the printhead assembly has been inserted properly.

The time between firing pulses is equal to [scan speed (inches/sec)/dots per inch]+margin. One type of calibration can be accomplished by the following steps. With the energy compensation circuit turned off (so that truncation does not occur), and with the pulse width set to a predetermined nominal maximum pulse width, e.g., 2.0 μsec, the turn-on voltage, $V_{turn-one, q}$, is measured one quadrant at a time. The system determines which quadrant turns on at the highest turn-on voltage $V_{turn-on, high}$, and which quadrant turns on at the lowest turn-on voltage $V_{turn-on, low}$. The difference between the highest turn-on voltage and the lowest turn-on voltage is determined. If the difference exceeds a specified maximum value, the printhead assembly may be rejected.

An exemplary calibration procedure for a printhead assembly during manufacture is as follows. First, the desired pulse width, minimum over-energy, $OE_{min,\%}$ and maximum over-energy, $OE_{max,\%}$ is selected. Next, the system measures the turn-on voltage for each quadrant for the selected pulse width.

The operating voltage, $V_{oper}$, is calculated from the minimum over-energy, $OE_{min,\%}$, using $$V_{oper}=V_{turn-on, max}[1+(OE_{min,\%})/100]^{1/2}$$

where $V_{turn-on, max}$ is the maximum turn-on voltage of all of the quadrants.

The power supply voltage is set to $V_{oper}$, and without firing the printhead assembly, the DAC and the slope settings are cycled through to find, wherein at least one slope setting in each quadrant does not truncate. If no DAC setting is found, wherein at least one slope in each quadrant does not truncate, the printhead assembly is preferably rejected. Otherwise, the highest DAC setting found that meets the above conditions and the higher slope settings corresponding to it are noted, and the maximum voltage, $V_{max}$, is calculated from the maximum over-energy, $OE_{max}$, using $$V_{max}=V_{turn-on, min}[1+(OE_{max,\%})/100]^{1/2}$$

where $V_{turn-on, min}$ is the minimum turn-on voltage of all of the quadrants.

Next, the power supply voltage, VPP, is set equal to the maximum voltage, $V_{max}$, and the DAC setting and quadrant slope adjustment settings found above are used, and truncation is checked. If all quadrants truncate, the printhead assembly is preferably accepted. Then, the operating voltage, $V_{oper}$, is varied to find the maximum operating voltage where no quadrant truncates with the selected DAC settings and quadrant slope adjustment settings. The operating voltage, $V_{oper}$, is set equal to the maximum voltage found. The operating voltage, DAC setting and the quadrant slope adjustment for each quadrant that were selected are written to the memory device.

With the final settings for quadrant slope adjustments, DAC setting and operating voltage written to the memory device during manufacturing, the printhead assembly may be delivered to a user, either in conjunction with a printer, or as a replacement cartridge. This enables the printer in which the printhead assembly is eventually installed to determine whether there are intolerably high parasitic resistances that were not detectable in the print cartridge alone during manufacturing calibration. Such resistances might occur with a printer wiring fault, or poor conduction at the print cartridge-printer contacts. If a high resistance were encountered, the system circuitry would compensate with a higher input voltage VPP. This is acceptable up to a point, but a too high a voltage needed to overcome resistance when all resistors are firing, will lead to a much higher voltage when firing a single resistor. Of course, this can be compensated for by substantial pulse width truncation to achieve controlled energy, but beyond a certain point, the resistor is unable to reliably withstand the power transmitted, as discussed above.

Calibration at Start-Up And During Printer Operation

Figure 25:
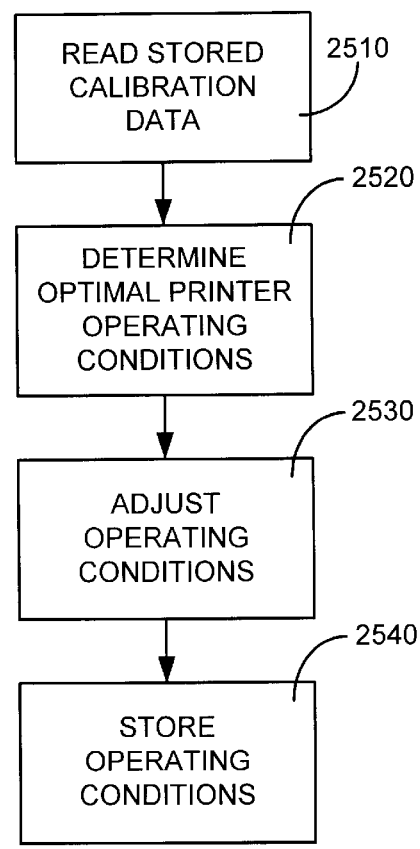
FIG. 25 illustrates a general flow diagram of a start-up calibration technique in accordance with the present invention.

With regard to start-up or installation calibration, in general, the calibration can be used to determine the operating settings to apply to the printhead assembly installed in the printer. FIG. 25 illustrates a general flow diagram of a start-up calibration technique in accordance with the present invention. Calibration information previously stored in the memory device is read first before start-up calibration is performed (box 2510). The printer can be set to use the calibration information. The calibration information can then be used to perform tests to determine the optimal operating conditions for the printer (box 2520). Next, the operating conditions are adjusted for the printer using the calibration information (box 2530). Last, the operating conditions can be stored in a memory device of the printer (box 2540).

Specifically, the controller can read data placed into the memory device, such as the printhead memory device, when the system is turned on. This reading can be used in a printer test to determine whether there are intolerably high parasitic resistances that were not detectable in the printhead assembly alone during factory calibration. Such resistances might occur with a printer wiring fault or a poor conduction at the pen-printer contacts. The controller or printhead assembly uses this information to set the proper power supply voltage for regulating the power supply voltage, and also for supplying certain registers with data such as slope information.

For example, if a high resistance were encountered, the system circuitry would compensate with a higher power supply voltage VPP. This is acceptable up to a point, but an excessively high VPP needed to overcome excessive resistance when all resistors are firing, will lead to a much higher voltage at a single firing resistor. This can be compensated for by substantial pulse width truncation to achieve controlled energy, for example. However, beyond a certain point, the resistor may be unable to reliably withstand the power transmitted.

Figure 26:
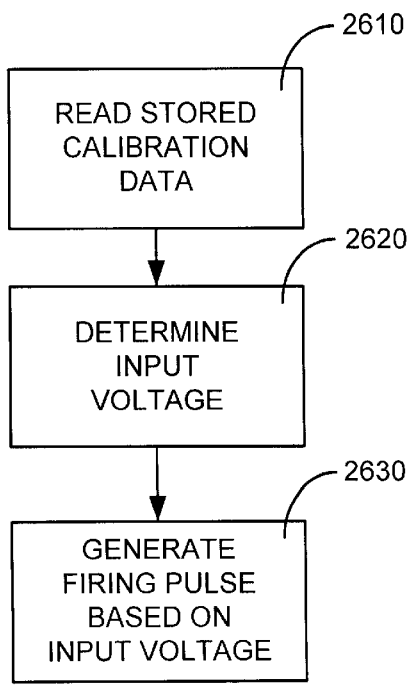
FIG. 26 illustrates a general flow diagram of calibration during printer operation.

Further, the energy control device of the exemplary embodiment can be calibrated during printer operation. FIG. 26 illustrates a general flow diagram of calibration during printer operation. As shown in FIG. 26, the printer can be calibrated by determining a nominal input voltage above a threshold necessary for simultaneous operation of a plurality of the resistors (box 2610). During printing, the input voltage on the print head can be detected at an input node connected to at least some of the resistors (box 2620). A firing pulse having a duration based on the detected input voltage at the node can be generated such that a detected input voltage higher than the nominal voltage is compensated for by a shortened firing pulse (box 2630).

Namely, in operation, the system is calibrated to set a voltage power supply, VPS, to a level adequate to ensure adequate firing energy levels for full drop volume firing in "blackout conditions" when all resistors are fired simultaneously. Because firing energy is typically proportional to the product of the square of the voltage and the time duration, VPS is preferably high enough to provide adequate energy within the limited time afforded for printing each dot, before the next dot is to be printed at the desired printer scan rate. Part of the calibration process includes establishing a setpoint voltage to provide a limited firing energy threshold for all firing conditions, regardless of the number of nozzles fired simultaneously.

When the output voltage reaches a preselected setpoint voltage determined experimentally at operational calibration (as will be discussed below), the comparator of the control block terminates the pulse transmitted to the firing resistors. In this process, when VPP is higher due only to a limited number of resistors being selected for firing, the voltage at the voltage-to-power converter will be higher, and the rate of charging of the capacitor will be increased. Consequently, the pulse will be terminated after a shorter duration to maintain a consistent energy delivered. In the event that VPP drops below the point determined during calibration, and the capacitor voltage does not reach the setpoint before the printer firing pulse ends, the printer fire pulse will override the comparator and terminate energy delivery. It is possible to compensate for such low VPP conditions by lengthening the firing pulse slightly after calibration, as long as the requirements of printhead assembly frequency and printing speed are not violated.

To operationally calibrate an installed printhead assembly to compensate for parasitic resistances in the printer and the printer-to-cartridge connection, VPP an be set by the printer to a default value based on a test operation in which nozzles are fired one quadrant at a time to generate the worst case possible parasitic voltage drops at the input lines for each of the sets of resistors across all of the primitives at its maximum firing frequency. If the printer has adequately fast throughput and carriage scan speed, the voltage is set with a firing pulse somewhat briefer than the desired time between pulses (i.e. less than [scan speed/dot pitch]+ margin). With this nominal maximum pulse duration, the default voltage is set to ensure that all nozzles are firing fully, above the transitional range. The determination of proper firing and function above the transitional range is suitably conducted for ink printing.

With a default VPP established, an energy calibration mode is enabled. In this mode, the energy control device, including the sense network, bias current generator, and control block are activated. The printer again delivers signals to generate firing from all nozzles of all primitives with the setpoint voltage set at a relatively high initial level to provide a high firing energy well beyond the transitional range. This process is preferably repeated at sequentially lower setpoint voltages until the cessation of pulse width truncation indicates that an optimum firing energy level has been reached. This is achieved by firing a pulse at nominal voltage, then checking a truncation status bit indicating whether a pulse was properly fired, then lowering the voltage by a small increment, and repeating the process.

During this calibration process, the status bit is set when the firing pulse is still high or active when the comparator trips. If the firing pulse drops or terminates before the comparator trips, the status bit is not set. When the voltage is at a low enough level, firing will not occur, and conventional printer drop sensing circuitry, which may include optical drop detectors, will set the status bit to a state indicating non-firing. The setpoint voltage is set above this non-firing voltage by a margin of safety to ensure firing.

Preferably, the setpoint voltage is set so that the firing pulse duration is no shorter than 1.6 $\mu$s, to avoid reliability problems associated with shorter duration high voltage pulses. Such reliability problems can arise when a too-high power is applied during a short duration to obtain the needed energy. Such extreme power creates high rates of temperature change in the resistors, which generates potentially damaging stresses. Optionally, the operational calibration process may continue until a sufficiently low setpoint is reached so that all quadrants are experiencing pulse truncation, thereby ensuring that none of the quadrants are firing at higher than needed energy levels. Ensuring truncation throughout the system also provides a margin for pulse expansion in unexpectedly low VPP conditions.

Figure 27:
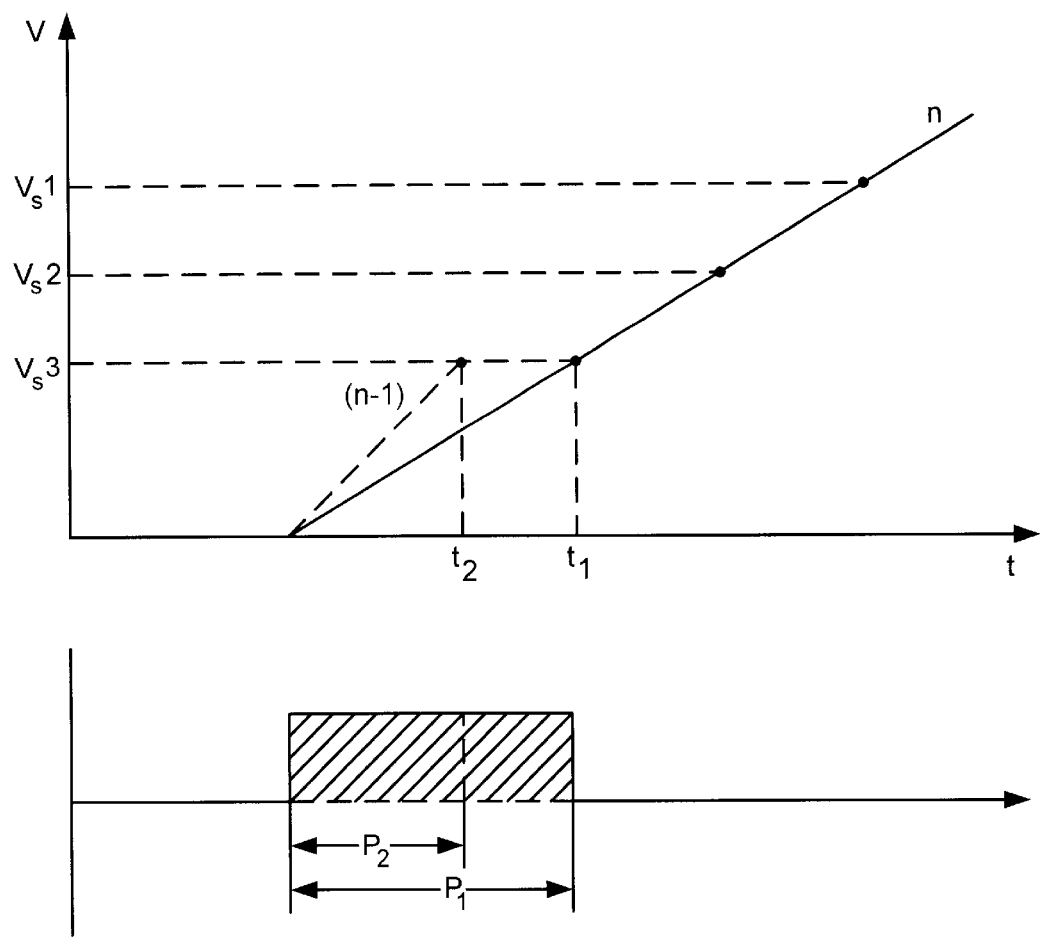
FIG. 27 illustrates how operational calibration and printing occur.

FIG. 27 illustrates how operational calibration and printing occur. In the upper portion of the graph, the vertical axis reflects the voltage at the converter output. As shown, the solid line "n" reflects a rising voltage as energy is dissipated by all n resistors firing. During calibration, the setpoint voltage is stepped down as shown until a suitable pulse width and printing performance is attained at Vs3. The voltage line n reaches the selected setpoint at time t1, terminating the pulse P1 as shown in the lower portion of the graph, which reflects the pulse output to the firing resistors at line 74. During subsequent operation after calibration, when less than all resistors are fired, such as with line (n−1) reflecting all resistors fired but one, the slope of the voltage line is steeper, causing it to reach the selected setpoint voltage Vs3 at an earlier time t2, providing a truncated pulse having duration P2 to compensate for the increased VPP and yield a consistent firing energy.

If calibration is done at the factory or calibration data is available, when the print cartridge is installed in the printer, the printer will do a test on the installed print cartridge to determine the correct power supply voltage, VPS to apply to the print cartridge. For example, the printer can read quadrant slope adjustments, such as +5%, 0, or −5%, one for each quadrant, the DAC setting and the operating voltage from the memory device. From this, the system can set the DAC and quadrant slope adjustment registers in the printer to these recorded values and set the printer power supply voltage VPS, to the value of the operating voltage, $V_{oper}$, contained in the memory device.

The printer observes the pulse width truncation flags, which are set when truncation occurs, for each quadrant while firing all resistors in a "blackout" pattern. The printer increases the printer power supply voltage VPS in small incremental steps and fires the resistors at each step until the first of the four quadrant truncation flags show truncation and the voltage, $V_{ps,\ trunc}$, at which this first truncation occurred is stored by the printer.

The printer determines the effects of the increase in supply voltage by calculating the ratio of $V^2PS_{trunc}/V^2_{oper}$. If this ratio is greater than or equal to a maximum limit, the print cartridge should be re-inserted and the test repeated. If the ratio does not exceed the maximum limit, then VPS is reduced one incremental step below the truncation voltage, $VPS_{trunc}$, and this value should be used by the printer as the power supply voltage. If the ratio remains greater than or equal to the maximum limit, the printer should be serviced.

The maximum limit is necessary because when excessive parasitic resistance is present, there is too large a difference in the amount of voltage applied to the print cartridge when all nozzles are firing and when only one nozzle is firing. The ratio, is indicative of added parasitic resistances which, when the resistors are fired individually, can cause a power increase in the heater resistors. The increased power in the resistors, is a resistor life consideration. It is therefore necessary to limit the power increase by limiting the added parasitic resistance as is done in the above procedure.

V. THERMAL CONTROL

The present invention also includes a thermal control system that improves stability, reliability, and PQ output of the printing system. The system maintains and controls the printhead assembly temperature at some desired optimum (that can be changed) and provides digital feedback to the printing system. In general, the thermal control system receives a sensed temperature of the driver head and generates a digital command, such as a digital word, proportional to this sensed temperature. The thermal control system analyzes the sensed temperature and makes control decisions based on the analysis. As such, the thermal control system is able to constantly maintain the temperature near the optimal minimum.

In a preferred embodiment, the processing driver head 120 includes a temperature sensor and a means to provide a digital word that correlates with the sensed temperature. This digital word is utilized by additional temperature monitoring and control circuitry that is preferably located at least in part on the processing driver head 120. Including at least some of this monitoring and control circuitry on the processing driver head 120 improves temperature control accuracy and shortens response times to temperature excursions. The temperature monitoring and control circuitry includes circuit elements such as registers for storing temperature-related information, converters for converting temperature-related signals back and forth between analog and digital format, controllers that respond to the temperature-related signals, etc. Specific examples of this temperature and monitoring circuitry are described in the ensuing discussions.

Figure 28:
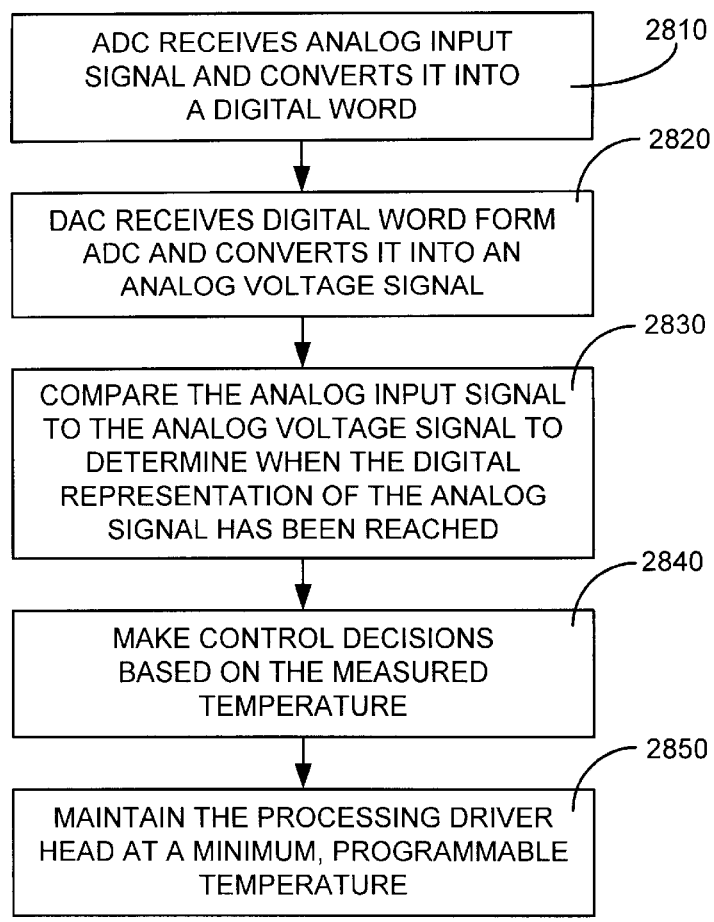
FIG. 28 illustrates a flow chart of the general operation of the thermal control device of the present invention.

FIG. 28 illustrates a flow chart of the general operation of the thermal control device of the present invention. In an exemplary embodiment, as shown in FIG. 28, the system preferably uses an analog-to-digital converter (ADC) for converting an analog voltage input signal to a substantially equivalent digital output signal having N bits (box 2810). The ADC preferably includes a conversion device, such as a counter (or a successive approximation register (SAR)), for providing the digital output signal and producing a digital word that is proportional to the measured temperature.

Next, a digital-to-analog converter (DAC) receives the digital output signal and converts the digital output signal into a substantially equivalent analog voltage signal (box 2820). A decision element, such as a digital comparator, can be used to compare the analog input signal to the analog voltage signal from the DAC to determine when the digital representation of the analog signal has been reached (box 2830) for making control decisions based on this measured temperature (box 2840). As a result, the thermal control system provides closed loop control for maintaining (box 2850) the processing driver head at or near an optimal, programmable temperature, and for deciding if an upper limit setpoint has been exceeded.

Also, it should be noted that since the untrimmed accuracy of the sensor can be low, the temperature sensor can be initially calibrated to correlate the sensor output to a known temperature.

Temperature Sensor Conversion

Specifically, a temperature sensor can be located on the processing driver head with a sensor voltage output proportional to a sensed temperature. The ADC converts the sensed temperature into a digital word and sends the digital word to the DAC. The DAC has a digital input and an output voltage proportional to the value of a digital word received by the digital input. The digital comparator has a first input connected to the sensor voltage output and a second input connected to the converter voltage output. The comparator generates an equivalency signal when the converter output voltage exceeds the sensor output voltage. The print head may have a temperature controller that compares the digital word to a preselected temperature threshold value to determine if the temperature is within a selected range. Also, a warming device (discussed in detail below) can be used to change the temperature of the processing driver head in response to a determination that the temperature is below the selected range.

Preferably, the temperature control system has four registers associated with it. A temperature set point register, a fault set point register, a control register, and a sensor output register. The temperature set point register holds the desired minimum processing driver head temperature. This temperature is maintained by enabling the warming device (discussed in detail below) when the measured driver head temperature is below the set point. The rate of warming is controlled by the state of two enable bits in the temperature control register, with each bit enabling 50% warming. The fault set point register holds the temperature at which fire pulses are blocked and an error signal generated. Once a temperature fault condition has been detected and corrected, the printer preferably clears the error condition to enable further nozzle operation.

Temperature conversion (analog to digital) can be achieved by comparing a proportional to absolute temperature (PTAT) voltage to the output from the temperature DAC. If the comparison indicates that the DAC output is below the PTAT voltage, the input word to the DAC is incremented and another comparison made. Once equality between the two voltages is detected, the input word to the DAC is saved to the sensor output register. The converter is normally free running and continuously updates the sensor output register.

The control register preferably contains bits for trickle warming control, sensor enable, free-run or one-shot control, DAC calibration enable, temperature regulation status, and temperature fault status. The register is read/write and is cleared after reset. The sensor output register holds the result of the most recent temperature conversion and is preferably undefined after power-up reset.

Working Example of Temperature Sensor Conversion

Figure 29:
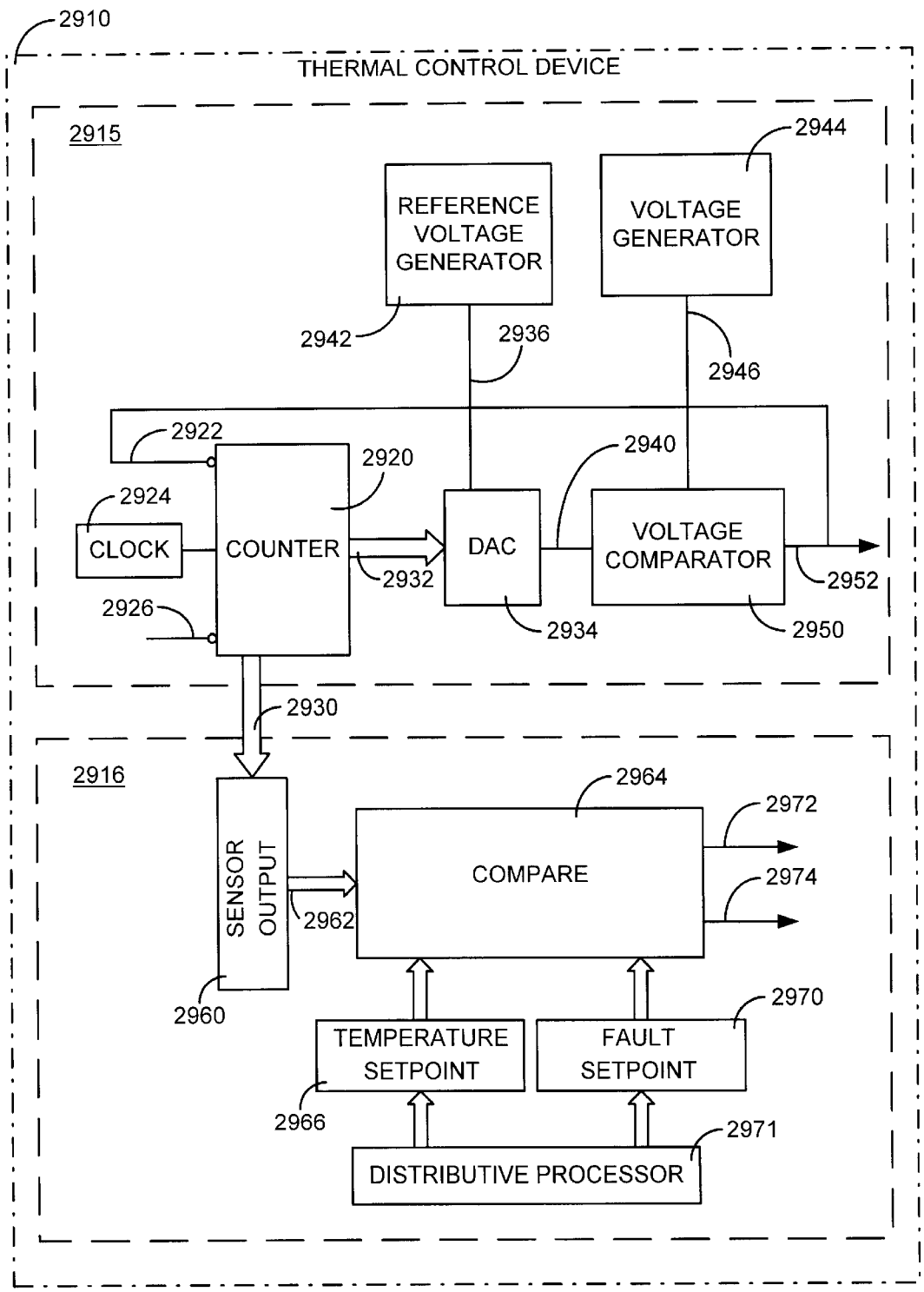
FIG. 29 is a block diagram of an exemplary thermal control system of the present invention.

As shown in FIG. 29, the thermal control device 2910 is preferably temperature circuitry and a part of the printhead driver head 120 (shown in FIG. 1) and includes a measurement section 2915 and a temperature control section 2916. The measurement section includes a digital counter 2920 having an enable input 2922, a clock input 2924, and a reset input 2926. The counter has a multi-bit output bus 2930, and a multi-bit control bus 2932. The counter is operable to generate a multi-bit digital word in an internal register that increments in response to pulses received on the clock line 2924 while the enable line is held low. When the enable signal is high, the register contents are held constant. When the reset line 2926 is pulsed, the counter register is cleared to zero. The register contents are expressed as high or low logic states on the respective lines of the output busses 2930, 2932.

The counter's control bus is connected to the inputs of a digital to analog converter (DAC) 2934, which has an analog reference voltage input line 2936, and an analog voltage output line 2940. The DAC generates an output voltage that is proportional to the voltage on the input line 2936 and to the value of the digital word received at the control bus 2932. When the control bus receives all zeros, the output voltage is half of the reference voltage, and when the control bus receives all ones, the output voltage is equal to the reference voltage on line 2936. A reference voltage generator 2942 generates the reference voltage, and includes conventional circuitry to maintain a stable voltage regardless of temperature variations or manufacturing process variations. In the preferred embodiment, the reference voltage is 5.12 V+/−0.1 V.

The measurement section 2915 includes a voltage generator 2944 on the processing driver head that generates a measurement voltage on line 2946. The measurement voltage is proportional to the absolute temperature of the die, and has a substantially linear output voltage relative to temperature. In one embodiment, the measurement voltage is equal to 2.7 V+(10 mV×T), with the temperature expressed in degrees Celsius, so that the voltage is 2.7 V at the freezing point of water, for instance.

A voltage comparator 2950 has a first input connected to the DAC output voltage line 2940, and a second input connected to the voltage generator output 2946. When the voltage of the DAC exceeds the measurement voltage on line 2946, the comparator will express a logic high on a converter output line 2952, which is connected to control logic circuitry and to the counter's enable line 2922.

The temperature sensing circuitry may operate continuously and independently of printing operations. In operation, when the print head is first installed in a printer, or when the printer is first powered on, the counter is reset to zero for a temperature measurement to begin. With the digital word zero transmitted to the DAC, the comparator 2950 evaluates whether the DAC 2934 output exceeds the output of the voltage generator 2944. If so, the converter output switches to high, signaling to logic circuitry that a measurement is complete, and disabling the counter from further incrementing by transmitting this voltage to the enable input 2922.

If the DAC voltage is below the temperature measurement voltage, the comparator output remains low, keeping the counter in an enabled state. In this state, the counter responds to the next clock pulse by incrementing the digital word in its register by a single bit. In response to this, the DAC output voltage is incremented by a step, and the comparator evaluates if the increased DAC output exceeds the measurement voltage. The incrementing process continues upward until the DAC voltage first exceeds the measurement voltage.

When this occurs, the comparator output switches to high, signaling to logic circuitry that a measurement is complete, and disabling the counter from further incrementing by transmitting this voltage to the enable input 2922. In normal circumstances, when the DAC voltage has just exceeded the measurement voltage, the counter register will contain and maintain the digital word corresponding to the temperature level of the die. After this encoded temperature value is read from the counter, the logic circuitry may reset the counter so that another measurement may begin.

The temperature control section 2916 of the circuit 2910 serves to read the calculated temperature value code from the counter, to determine if it is within a preselected range, and to warm the processing driver head if too cold, or to disable or warm the printer to slow the printing operations if the temperature is too high. The control section includes a sensor output register 2960 connected to the output bus 2930 to receive and store the digital word received from the counter. The register 2960 has an output bus 2962 connected to a digital comparator circuit 2964. The register is connected to the logic circuitry so that the logic circuitry may initiate storage of the digital word when the "measurement complete" signal is received from the converter 2950, and so that the counter may be reset and re-enabled after the word has been stored in register 2960.

The comparator 2964 has three input busses: bus 2962 and second and third busses connected respectively to a low temperature setpoint register 2966, and to a fault setpoint register 2970. Each setpoint register is connected to logic circuitry on the distributive processor 2971 that receives setpoint data from the printer over the serial command line. The setpoint values are seven bit digital words that are encoded on the same scale as the measured temperature data. The low temperature setpoint value corresponds to the minimum acceptable operating temperature, below which the processing driver head is considered not warmed up. The fault temperature setpoint value corresponds to the maximum acceptable operating temperature, above which the is considered too hot to operate safely or reliably.

The comparator has a fault output line 2972 that connects to logic circuitry, and which is set low when the value of the sensor output word is less than the value of the fault setpoint value, and is set high when the value of the sensor output word is greater than the value of the fault setpoint value. A warming output line 2974 from the comparator also connects to logic circuitry, and is set low when the value of the sensor output word is greater than the value of the temperature setpoint value, and high when the value of the sensor output word is less than the value of the temperature setpoint value.

Logic circuitry responds to a low signal from both outputs 2972, 2974 with normal operation. If logic circuitry detects a high level on the fault line, it signals the printer via the command line either to stop printing and display a fault message, or to slow printing to reduce heat accumulation. The logic circuitry may also connect directly to the firing circuitry to provide on-processing driver head disablement capabilities in the event of printer error. If logic circuitry detects a high level on the warming line, it activates warming circuitry on the processing driver head that continues to warm the processing driver head until the warming signal drops low in response to the measured temperature rising to the selected setpoint. Printing is deferred or suspended until warming is complete.

In normal operation, the temperature will be below the low setpoint when the printer is first turned on, so that warming will occur for multiple temperature measurement cycles until the setpoint is reached. With the printer on and idle, the warming will cycle on as the processing driver head temperature drops below the setpoint, and off as processing driver head temperature exceeds the setpoint, maintaining a minimum temperature within a narrow range that is no wider than required for proper printing, due to the continuous and rapid measurement cycling. When printing begins, the processing driver head may warm from normal operation, making further warming unnecessary, unless the printer becomes idle or is printing a very sparse pattern firing few nozzles. If printing is heavy, with most or all nozzles firing for a prolonged period, the processing driver head temperature may reach the fault threshold, and printing may be slowed, or interrupted until the processing driver head temperature drops below the fault level, or halted altogether.

To provide additional control, the comparator 2964 may evaluate the magnitude by which the measured voltage word departs from the desired range, and take action of varying magnitude accordingly. A slight exceeding of the fault setpoint may initiate slowed printing, while a greater margin of departure causes printing to halt. Similarly, at the lower setpoint, a faster rate of warming may be provided until a first temperature is reached, and a slower warming rate until a higher temperature is reached. These features require the output lines 2972, 2974 to be multi bit busses.

In one embodiment, the system has a sensing range from 0° C. to 120° C., and a nominal conversion time of about 120 μS for 40° C. at 4 MHz clock frequency. In this embodiment, the DAC is a 128 element precision polysilicon strip with 127 taps. Each tap is routed through a series of analog switches controlled by a decoded version of the input word. The reference voltage is derived from a bandgap reference, and varies by only +/−4% over possible permutations of process and operating temperatures. The DAC has an offset of 2.56 V to ease design constraints on the sensor and comparator circuits, and has a resolution of 20 mV per increment, which yields a temperature resolution of +/−2° C., and 2° C. per count in the output register.

VI. WARMING DEVICE

In response to the determination that the driver head has fallen below a threshold temperature, a warming device is used to raise the temperature of the processing driver head. The driver head includes firing resistors for ejecting ink droplets that each have a minimum current that causes ejection of an ink drop. Controlling the electrical current allows the warming device coupled to the firing resistors to provide enough current to the firing resistors to raise the temperature of the driver head without exceeding the minimum current required to eject an ink drop.

Figure 30:
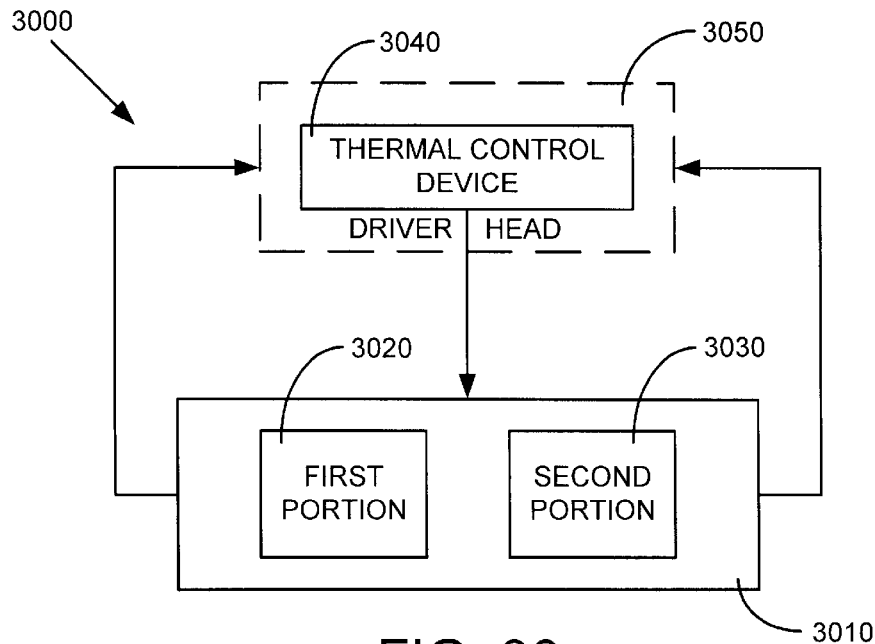
FIG. 30 illustrates an exemplary warming device system of the present invention.

As an example, FIG. 30 illustrates an exemplary warming device system. The warming device 3000 can be a warming circuit 3010 with segmented first and second portions 3020, 3030. The warming circuit 3010 is electrically coupled to the thermal control device 3040 of the driver head 3050 for receiving control signals. In response to a need to increase the temperature of the driver head 3050 (as discussed above in the thermal control section), the driver head 3050 sends an activation signal to the warming circuit 3010. The first portion 3020 warms at least one firing resistor, and preferably a set of firing resistors, by providing current below the threshold firing current. The second portion 3030 provides current above the threshold for ejecting an ink drop. As a result, the temperature of the driver head 3050 is raised without causing any of the firing resistors to eject an ink drop by the actions of the warming device 3000.

Figure 31:
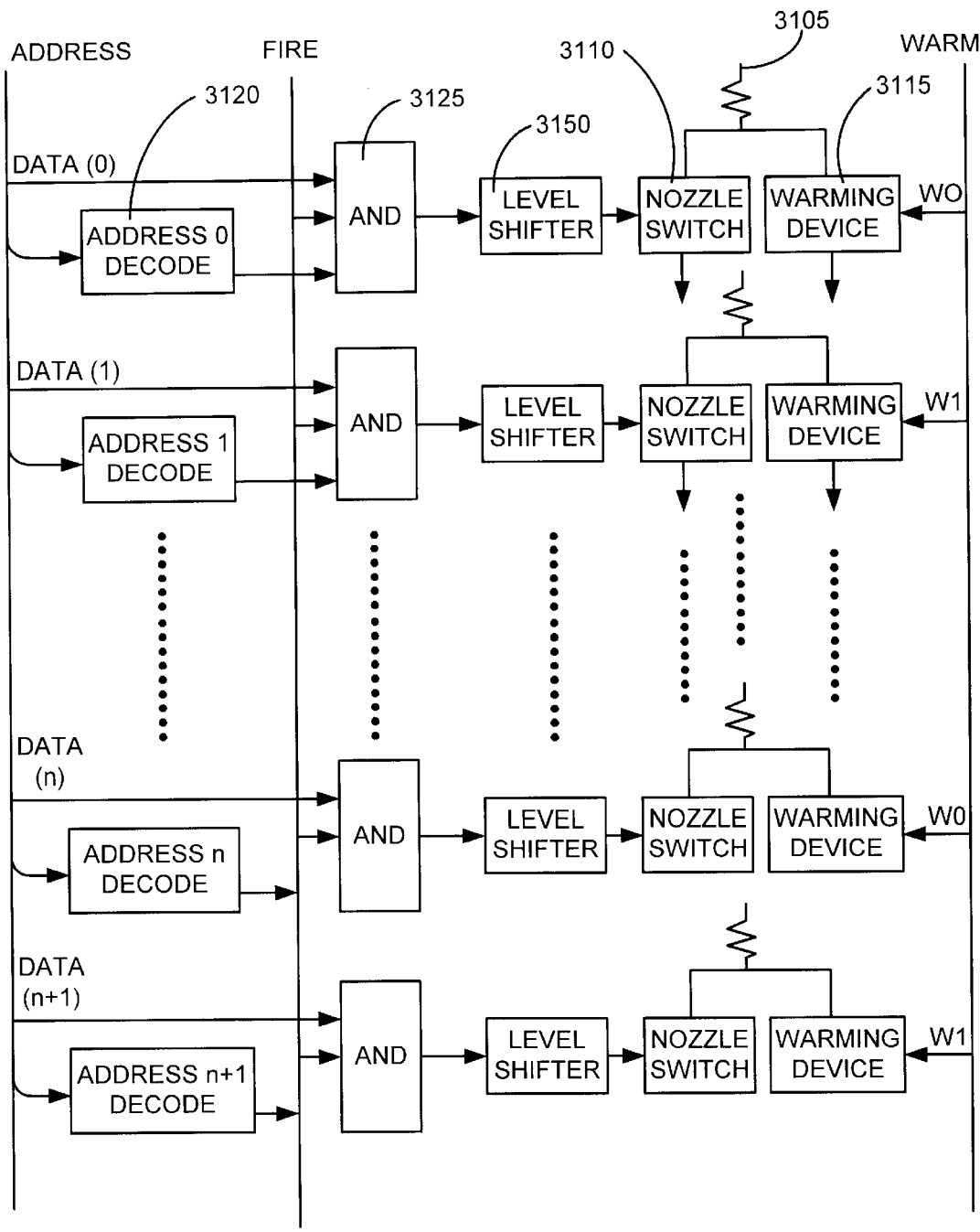
FIG. 31 is a detailed illustration of the nozzle drive logic of FIG. 20 incorporating the warming device of FIG. 30.

Specifically, FIG. 31 is a detailed illustration of the nozzle drive logic 3125 of FIGS. 20 incorporating the device of FIG. 30. In the working example of FIG. 31, there are n nozzles (0-n) shown and each process described is replicated for each of these nozzles. Each resistor 3105 is connected to ground through a nozzle transistor 3110 and a warming device 3115. The nozzle transistor 3110 and the warming device 3115 can be power field effect transistors (FETS). The warming device 3115 provides the capability to warm the printhead assembly to any desired temperature before arid during printing operations. This process is called "trickle warming" because the printhead assembly allows a trickle of energy to flow through the warming device 3115. This trickle energy delivers enough energy to heat the printhead assembly but not enough energy to cause the resistors to eject an ink drop. The printhead assembly temperature rises until the desired temperature is reached and the warming device 3115 is then shut off.

In one embodiment, as shown in FIG. 31, the nozzle switch 3110 and the warming device 3115 are connected in parallel to the resistor 3105. The purpose of the warming device 3115 is to provide a way to warm the printhead assembly when it is below an optimal printing temperature. Preferably the warming device 3115 lies as close as possible to the associated resistor 3105. The nozzle switch 3110 is turned on by the combination of the address decode 3120, the "and" block 3125 and the level shifter 3130. Each of these devices helps determine when the nozzle switch 3110 will be turned on. This determination is based on (1) whether the nozzle has been selected to receive data; (2) whether a fire pulse has been sent to the nozzle; and (3) whether the address sent from the primitive matches the address of the nozzle transistor. In addition to the above systems, the nozzle drive logic 3125 also contains multiple data latches (not shown). These data latches provide data storage at each nozzle.

Working Example of Warming Device

For each nozzle, a printhead circuit preferably includes a warming transistor with a drive transistor and a heating resistor. The drive transistor outputs a firing pulse to the heating resistor. The firing pulse is of a current magnitude sufficient to heat the resistor and ink enough to eject the ink from a nozzle. The warming transistor generates a warming pulse to the heating resistor. The warming pulse is of a current magnitude less than that of the firing pulse. The purpose of sending warming pulses to respective heating resistors is to maintain the printhead at a desired temperature during a print cycle.

For each nozzle, the source junction of the warming transistor is coupled in common to the source junction of the drive transistor. In addition, the drain junction of the warming transistor is coupled to the drain junction of the drive transistor. In one embodiment, the commonly coupled source junctions are tied to ground, while the commonly coupled drain junctions are connected to the heating resistor.

The warming transistor is preferably laid out to share a common wiring line interconnect with the drive transistor for the source contact, and a common wiring line interconnect with the drive transistor for the drain contact. The warming transistor is laid out as a segmented portion of the drive transistor having a separate gate contact. An advantage of such layout is that additional area is not required on the processing driver head to include a separate warming transistor. Additional interconnect lengths are not needed. An additional contact is included for the warming transistor gate and another contact (e.g., warming transistor gate contact) is preferably added. In an embodiment in which the warming transistor is activated and joins with the drive transistor in sensing current to the heating resistor during firing, the same amount of power is achievable as for a prior layout of a drive transistor alone without a warming transistor being present. The same amount of substrate area is used for the warming and drive transistor as for the prior one drive transistor.

The foregoing has described the principles, preferred embodiments and modes of operation of the present invention. However, the invention should not be construed as being limited to the particular embodiments discussed. As an example, the above-described inventions can be used in conjunction with inkjet printers that are not of the thermal type, as well as inkjet printers that are of the thermal type. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. An inkjet printing apparatus forming at least a portion of a printing system, the printing system including a printer portion including a system controller that provides printing system control signals, the printing apparatus comprising:
 a printhead assembly mechanically and electrically coupled to the printer portion and including an integrated energy setpoint register that stores an amount of energy to be delivered to emit ink with a low temperature setpoint register that corresponds to a minimum acceptable operating temperature and a fault setpoint register that corresponds to a maximum acceptable operating temperature.

2. An inkjet printing apparatus forming at least a portion of a printing system, the printing system including a printhead assembly, the printhead assembly including a plurality of drop generators, the printing apparatus comprising:
 an energy setpoint register integrated with the printhead assembly and including a low temperature setpoint register that corresponds to a minimum acceptable operating temperature and a fault setpoint register that corresponds to a maximum acceptable operating temperature; and
 a printer portion adapted to receive the printhead assembly and including a system controller configured to provide data to the energy setpoint register, the data indicative of an amount of energy to be delivered to the plurality of drop generators.

3. The inkjet printing apparatus of claim 1, further comprising a plurality of ink drop generators that emit the ink in response to the control signals and an integrated memory device with calibration information stored therein, wherein the system controller accesses the memory device and uses the calibration information for performing tests.

4. The inkjet printing apparatus of claim 3, wherein the tests are used to determine optimal operating conditions for the printing apparatus and for storing and using the optimal operating conditions.

5. The inkjet printing apparatus of claim 3, wherein performing tests further comprises observing a pulse width truncation flag for each group.

6. The inkjet printing apparatus of claim 3, wherein the drop generators are grouped into sections and further comprising a device for determining a maximum operating voltage by varying the operating voltage such that none of the sections truncate.

7. The printing apparatus as set forth in claim 4, wherein using the operating conditions comprises increasing a printer power supply voltage in small incremental steps and firing the resistors at each step until a group flag shows truncation.

8. The inkjet printing apparatus of claim 2, further comprising:
 a media moving mechanism;
 a printhead support mechanism that supports the printhead assembly in relation to the media moving mechanism; and
 an ink supply for providing ink to the printhead.

9. The inkjet printing apparatus of claim 3, further comprising a substrate having a front surface and an opposing back surface and ink ejection elements being formed on the front surface.

10. The inkjet printing apparatus of claim 2, further comprising an integrated memory device with calibration information stored therein, wherein the controller accesses the memory device and uses the calibration information for performing tests.

11. The inkjet printing apparatus of claim 10, wherein the tests are used to determine optimal operating conditions for the printing apparatus and for storing and using the optimal operating conditions.

12. The printing apparatus as set forth in claim 11, wherein using the operating conditions comprises increasing a printer power supply voltage in small incremental steps and firing the resistors at each step until a group flag shows truncation.

13. A printing method comprising:
 corresponding a low temperature setpoint register of an energy setpoint register to a minimum acceptable operating temperature;
 corresponding a fault setpoint register of the energy setpoint register to a maximum acceptable operating temperature;
 configuring a controller to automatically provide data to the energy setpoint register; and
 automatically using the data to determine an amount of energy to be delivered to a plurality of drop generators.

14. The method of claim 13, further comprising storing calibration information on an integrated memory device and accessing the memory device and using the calibration information for performing tests.

15. The method claim 14, determining optimal operating conditions from the tests for printing, and storing and using the optimal operating conditions.

16. The method of claim 14, wherein performing tests further comprises observing a pulse width truncation flag for each group.

17. The method of claim 15, wherein using the operating conditions comprises increasing a printer power supply voltage in small incremental steps and firing the drop generators at each step until a group flag shows truncation.

18. The method of claim 13, wherein the drop generators are defined by sections, each section having electrical components with associated electrical characteristics.

19. The method of claim 18, further comprising:
 selecting a testing range;
 measuring the electrical characteristics of the electrical components over the testing range;
 calculating an optimal calibration value for the electrical characteristics of each section; and
 storing the optimal calibration values.

20. The method of claim 19, further comprising sending a firing pulse to the electrical components, wherein the firing pulse has an associated pulse width, minimum over-energy and maximum over-energy.

21. The method of claim 20, wherein selecting testing range further comprises selecting the pulse width, minimum over-energy and maximum over-energy and measuring the electrical characteristics further comprises measuring a turn-on voltage of each section for the selected pulse width.

22. The method of claim 20 wherein calculating an optimal calibration value further comprises calculating an operating voltage from the selected minimum over-energy.

\* \* \* \* \*

UNITED STATES PATENT AND TRADEMARK OFFICE
CERTIFICATE OF CORRECTION

PATENT NO. : 6,575,548 B1
DATED : June 10, 2003
INVENTOR(S) : George H. Corrigan, III et al.

It is certified that error appears in the above-identified patent and that said Letters Patent is hereby corrected as shown below:

Column 1,
Line 33, delete "pixels"" and insert therefor -- "pixels" --

Column 5,
Line 50, after "sheet" insert -- is --

Column 6,
Line 42, delete "pa(is" and insert therefor -- pads --
Line 47, delete "an" and insert therefor -- (an --

Column 8,
Line 6, after "widened" delete "to"

Column 9,
Line 67, delete "loacing" and insert therefor -- loading --

Column 13,
Line 7, delete "valued" and insert therefor -- value --
Line 31, after "established" insert -- to --
Line 52, after "time" insert -- of --

Column 15,
Line 58, delete "ar" and insert therefor -- an --

Column 17,
Line 10, delete "for" and insert therefor -- (or --

Column 19,
Line 2, delete "printed ." and insert therefor -- printed. --

Column 20,
Line 33, delete "arid" and insert therefor -- and --
Line 52, delete "paral el" and insert therefor -- parallel --

Column 22,
Line 3, after "by" delete ","

UNITED STATES PATENT AND TRADEMARK OFFICE
CERTIFICATE OF CORRECTION

PATENT NO. : 6,575,548 B1
DATED : June 10, 2003
INVENTOR(S) : George H. Corrigan, III et al.

It is certified that error appears in the above-identified patent and that said Letters Patent is hereby corrected as shown below:

Column 24,
Line 2, delete "tits" and insert therefor -- bits --
Line 46, delete "or" and insert therefor -- on --
Line 67, after "cycles" insert -- . --

Column 26,
Line 46, delete "with n" and insert therefor -- within --

Column 28,
Line 5, after "but" delete "a"

Column 30,
Line 50, after "$V^2_{oper}$" insert -- . --

Column 38,
Line 30, after "method" insert -- of --

Signed and Sealed this

First Day of February, 2005

JON W. DUDAS
*Director of the United States Patent and Trademark Office*